United States Patent
Lee et al.

(10) Patent No.: US 9,324,727 B2
(45) Date of Patent: Apr. 26, 2016

(54) MEMORY DEVICES HAVING SEMICONDUCTOR PATTERNS ON A SUBSTRATE AND METHODS OF MANUFACTURING THE SAME

(71) Applicants: Chang-Hyun Lee, Suwon-si (KR); Hyun-Jung Kim, Suwon-Si (KR); Dong-Hoon Jang, Seoul (KR); Albert Fayrushin, Suwon-si (KR)

(72) Inventors: Chang-Hyun Lee, Suwon-si (KR); Hyun-Jung Kim, Suwon-Si (KR); Dong-Hoon Jang, Seoul (KR); Albert Fayrushin, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/176,332

(22) Filed: Feb. 10, 2014

(65) Prior Publication Data
US 2014/0264548 A1 Sep. 18, 2014

(30) Foreign Application Priority Data
Mar. 14, 2013 (KR) .................. 10-2013-0027261

(51) Int. Cl.
*H01L 27/115* (2006.01)
*H01L 21/762* (2006.01)
*H01L 23/48* (2006.01)
*H01L 29/788* (2006.01)

(52) U.S. Cl.
CPC .... *H01L 27/11582* (2013.01); *H01L 27/11551* (2013.01); *H01L 29/7889* (2013.01); *H01L 21/76224* (2013.01); *H01L 27/11565* (2013.01)

(58) Field of Classification Search
CPC ............ H01L 21/8247; H01L 21/8238; H01L 27/115
USPC ........... 257/316, 324–326; 438/268, 257, 258
See application file for complete search history.

(56) References Cited

U.S. PATENT DOCUMENTS

| | | | |
|---|---|---|---|
| 7,696,559 B2 | 4/2010 | Arai et al. | |
| 8,030,700 B2 | 10/2011 | Sakamoto | |
| 2009/0267128 A1 | 10/2009 | Maejima | |
| 2010/0237402 A1 | 9/2010 | Sekine et al. | |
| 2010/0258947 A1 | 10/2010 | Jeong et al. | |
| 2010/0314678 A1 | 12/2010 | Lim et al. | |
| 2011/0090737 A1 | 4/2011 | Yoo et al. | |
| 2011/0169071 A1 | 7/2011 | Uenaka et al. | |
| 2011/0199825 A1 | 8/2011 | Han et al. | |
| 2011/0310670 A1* | 12/2011 | Shim et al. | 365/185.17 |
| 2012/0275234 A1* | 11/2012 | Lee et al. | 365/185.23 |

FOREIGN PATENT DOCUMENTS

| | | |
|---|---|---|
| JP | 2011-204856 | 10/2011 |
| KR | 1020110049187 A | 5/2011 |

* cited by examiner

*Primary Examiner* — Evan Pert
*Assistant Examiner* — Changhyun Yi
(74) *Attorney, Agent, or Firm* — Myers Bigel & Sibley, P.A.

(57) ABSTRACT

A memory device may include a plurality of semiconductor patterns on a substrate including a plurality of first impurity regions doped at a first impurity concentration, a plurality of second impurity regions at portions of the substrate contacting the plurality of semiconductor patterns and doped at a second impurity concentration, a plurality of channel patterns on the plurality of semiconductor patterns, a plurality of gate structures, a plurality of third impurity regions at portions of the substrate adjacent to end portions of the plurality of gate structures, and a plurality of fourth impurity regions at portions of the substrate between the second and third impurity regions and between adjacent second impurity regions. The plurality of fourth impurity regions may be doped at a third impurity concentration which may be lower than the first and second impurity concentrations.

24 Claims, 18 Drawing Sheets

MEMORY DEVICES HAVING SEMICONDUCTOR PATTERNS ON A SUBSTRATE AND METHODS OF MANUFACTURING THE SAME

CROSS-REFERENCE TO RELATED APPLICATION

This application claims priority under 35 U.S.C. §119 to Korean Patent Application No. 10-2013-0027261, filed on Mar. 14, 2013 in the Korean Intellectual Property Office (KIPO), the contents of which are herein incorporated by reference in their entirety.

FIELD

The present inventive concepts relate to semiconductor devices, and more particularly to vertical memory devices.

BACKGROUND

For a high integration of semiconductor elements, methods of stacking cells in a vertical direction, i.e., vertical memory devices have been developed. It may be beneficial for each transistor included in the vertical memory devices to have uniform electric characteristics.

SUMMARY

According to some embodiments of the inventive concepts, there is provided a memory device. The memory device may include a plurality of semiconductor patterns on a substrate. Each of the plurality of semiconductor patterns may include a first impurity region doped at a first impurity concentration with first impurities. The first impurities may include a first conductive type. The memory device may include a plurality of second impurity regions at a plurality of first upper portions of the substrate. Each of the plurality of second impurity regions may contact one of the plurality of semiconductor patterns and may be doped at a second impurity concentration with second impurities. The second impurities may include the first conductive type. The memory device may include a plurality of channel patterns on the plurality of semiconductor patterns. Each of the plurality of channel patterns may correspond to a respective one of the plurality of semiconductor patterns and may extend in a first direction substantially perpendicular to a top surface of the substrate. The memory device may include a plurality of gate structures. Each of the plurality of gate structures may extend in a second direction substantially parallel to the top surface of the substrate and may be adjacent to a sidewall of each of one or more of the plurality of channel patterns. The plurality of gate structures may be spaced apart from each other in the first direction. The memory device may include a plurality of third impurity regions at a plurality of second upper portions of the substrate adjacent to end portions of the plurality of gate structures. Each of the plurality of third impurity regions may be doped with third impurities and may be configured to provide a common source line. The third impurities may include a second conductive type different from the first conductive type. The memory device may include a plurality of fourth impurity regions at a plurality of third upper portions of the substrate between the second and third impurity regions and between adjacent second impurity regions. Each of the plurality of fourth impurity regions may be doped at a third impurity concentration with fourth impurities. The third impurity concentration may be lower than the first and second impurity concentrations.

The fourth impurities may include the first conductive type or the second conductive type.

The plurality of first and second impurity regions may be configured to provide a plurality of vertical channel regions of a plurality of ground selection transistors and the plurality of fourth impurity regions may be configured to provide a plurality of horizontal channel regions thereof.

A top surface of each of the plurality of semiconductor patterns may be coplanar with or lower than a top surface of a lowermost one of the plurality of gate structures in the first direction relative to the top surface of the substrate.

A top surface of each of the plurality of semiconductor patterns may be higher than a top surface of a lowermost one of the plurality of gate structures in the first direction relative to the top surface of the substrate.

Each of the plurality of second impurity regions may have a first depth from the top surface of the substrate. Each of the plurality of fourth impurity regions may have a second depth from the top surface of the substrate. The second depth may be less deep than the first depth.

The substrate may be doped at a fourth impurity concentration with fifth impurities. The fourth impurity concentration may be lower than the first and second impurity concentrations. The fifth impurities may include the first conductive type.

The memory device may include a plurality of recessed portions of the substrate. Each of the plurality of semiconductor patterns may extend from a respective one of the plurality of recessed portions.

The plurality of channel patterns may be arranged in a plurality of channel pattern columns which extend in the second direction. The plurality of channel pattern columns may be arranged in a channel pattern array which extends in a third direction which is substantially parallel to the top surface of the substrate and substantially perpendicular to the second direction.

Each of the plurality of gate structures may be adjacent to a sidewall of each of the channel patterns included in at least two of the plurality of channel pattern columns.

According to some embodiments of the inventive concepts, there is provided a method of manufacturing a memory device. A preliminary impurity region may be formed at a first upper portion of a substrate. The preliminary impurity region may be doped at a first impurity concentration with first impurities. A plurality of insulating interlayers and sacrificial layers may be alternately formed on the substrate. A plurality of channel holes may be formed through the sacrificial layers and the insulating interlayers. Each of the plurality of channel holes may expose a respective one of a plurality of portions of a top surface of the substrate. A plurality of first impurity regions may be formed at the plurality of portions of the top surface of the substrate exposed by the plurality of channel holes. The plurality of first impurity regions may be doped at a second impurity concentration with second impurities. The second impurities may include a first conductive type. The second impurity concentration may be higher than the first impurity concentration. A plurality of semiconductor patterns may be formed. Each of the plurality of semiconductor patterns may be formed on a respective one of the plurality of first impurity regions and may include a respective one of a plurality of second impurity regions. The plurality of second impurity regions may be doped at a third impurity concentration with third impurities. The third impurities may include the first conductive type. The third impurity concentration may be higher than the first impurity concentration. A plurality of channel patterns may be formed. Each of the plurality of channel patterns may be formed on a respective one of the plurality of semiconductor patterns. A plurality of openings may be formed through the sacrificial layers and the insulating interlayers. Each of the plurality of openings may expose a respective one of a plurality of portions of the top surface of the substrate. A plurality of third impurity regions may be formed at the plurality of portions of the top surface of the substrate exposed by the plurality of openings. The plurality of third impurity regions may be doped with fourth impurities. The fourth impurities may include a second conductive type different from the first conductive type. The plurality of sacrificial layers exposed by the channel holes may be removed. A plurality of gate structures may be formed. Each of the plurality of gate structures may extend substantially parallel to the top surface of the substrate and may be adjacent to a sidewall of each of one or more of the plurality of channel patterns. The gate structures may be spaced apart from each other in a first direction substantially perpendicular to the top surface of the substrate.

The forming of the plurality of first impurity regions may include performing an ion implantation process.

The forming of the plurality of semiconductor patterns including the plurality of second impurity regions may include performing a selective epitaxial growth (SEG) process and an ion implantation process in-situ.

The channel holes may be formed through the sacrificial layers, the insulating interlayers and at least an upper portion of the substrate, to form a recess.

According to some embodiments of the inventive concepts, there is provided a memory device. The memory device may include a semiconductor substrate. The substrate may include a first concentration of a first conductivity type of impurity. The memory device may include a plurality of semiconductor patterns on the substrate. Each of the plurality of semiconductor patterns may include a second concentration of the first conductivity type of impurity. The second concentration may be greater than the first concentration. The memory device may include a plurality of channel patterns on the plurality of semiconductor patterns. Each of the plurality of channel patterns may correspond to a respective one of the plurality of semiconductor patterns and extend substantially perpendicular to a top surface of the substrate. The memory device may include a plurality of gate structures. Each of the plurality of gate structures may extend substantially parallel to the top surface of the substrate. The memory device may include a plurality of common source lines at the top surface of the substrate. Each of the plurality of common source lines may be adjacent to end portions of the plurality of gate structures and may include a second conductivity type of impurity. The second conductivity type of impurity may be different from the first conductivity type of impurity. The memory device may include a plurality of channel regions at the top surface of the substrate extending between the plurality of semiconductor patterns and the plurality of common source lines and between adjacent semiconductor patterns. The channel regions may include a third concentration of impurity. The third concentration may be less than the second concentration.

The channel regions may be first channel regions and the memory device may also include a plurality of second channel regions at the top surface of the substrate. Each of the plurality of second channel regions may include a fourth concentration of the first conductivity type of impurity and may contact a respective one of the plurality of semiconductor patterns. The fourth concentration may be greater than the third concentration.

Each of the plurality of semiconductor patterns may extend from a recessed portion of the substrate.

A top surface of each of the plurality of semiconductor patterns may be coplanar with or higher than a top surface of a lowermost one of the plurality of gate structures relative to the top surface of the substrate.

A top surface of each of the plurality of semiconductor patterns may be coplanar with or lower than a bottom surface of a lowermost one of the plurality of gate structures relative to the top surface of the substrate.

Each of the plurality of channel regions may include the first conductivity type of impurity.

Each of the plurality of channel regions may include the second conductivity type of impurity.

DETAILED DESCRIPTION

Figure 1:
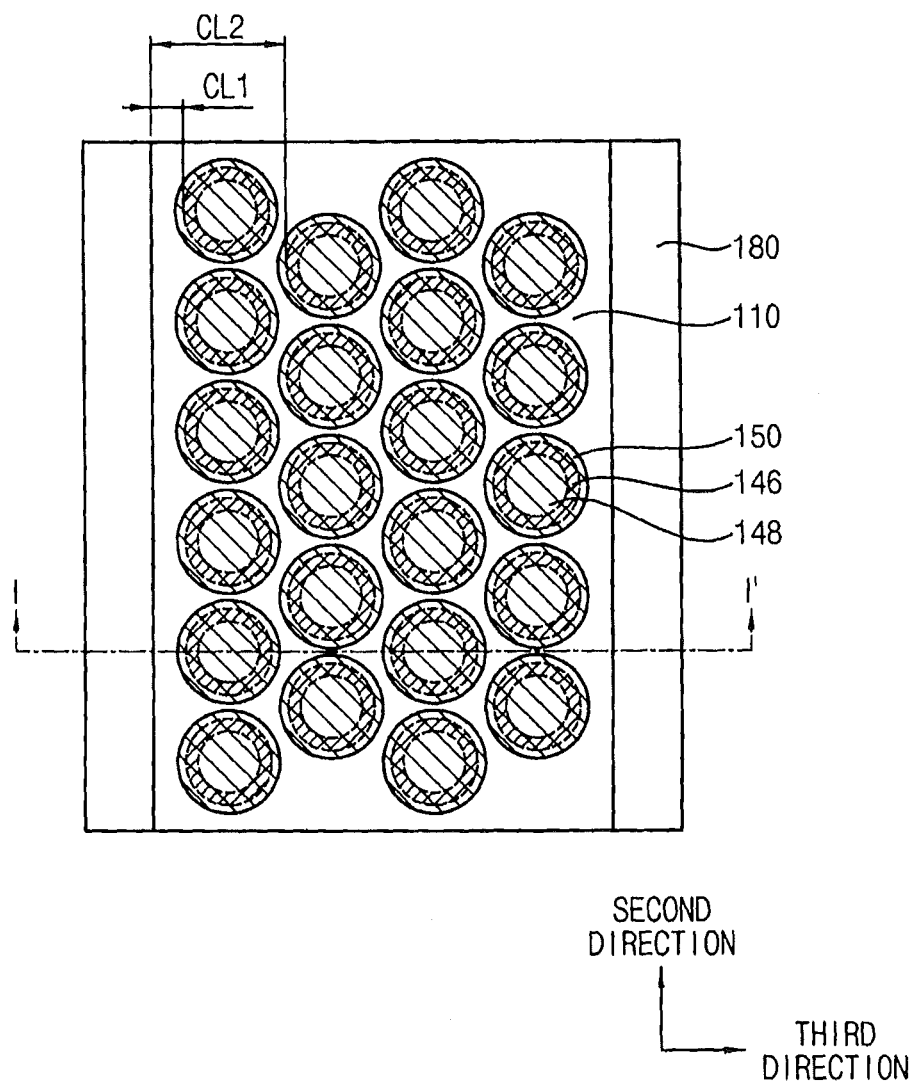
FIG. 1 is a plan view illustrating a vertical memory device in accordance with example embodiments.

Embodiments of the inventive concepts will now be described more fully with reference to the accompanying drawings, in which example embodiments are shown. Example embodiments may, however, be embodied in many different forms and should not be construed as limited to the example embodiments set forth herein. Rather, these embodiments are provided as examples so that this disclosure will be thorough and complete, and will fully convey the scope of the invention to those skilled in the art. In the drawings, the thicknesses of layers and regions may be exaggerated for clarity. Like reference numerals in the drawings denote like elements.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent").

It will be understood that, although the terms first, second, third, etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

It will be understood that when an element is referred to as being "at" an upper portion of a substrate, it can at least partially be contained within the substrate at a depth from a top surface of the substrate. In contrast, when an element is referred to as being "on" a substrate, it will be understood that the element can be contained outside of the substrate extending from a top surface of the substrate.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present disclosure.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
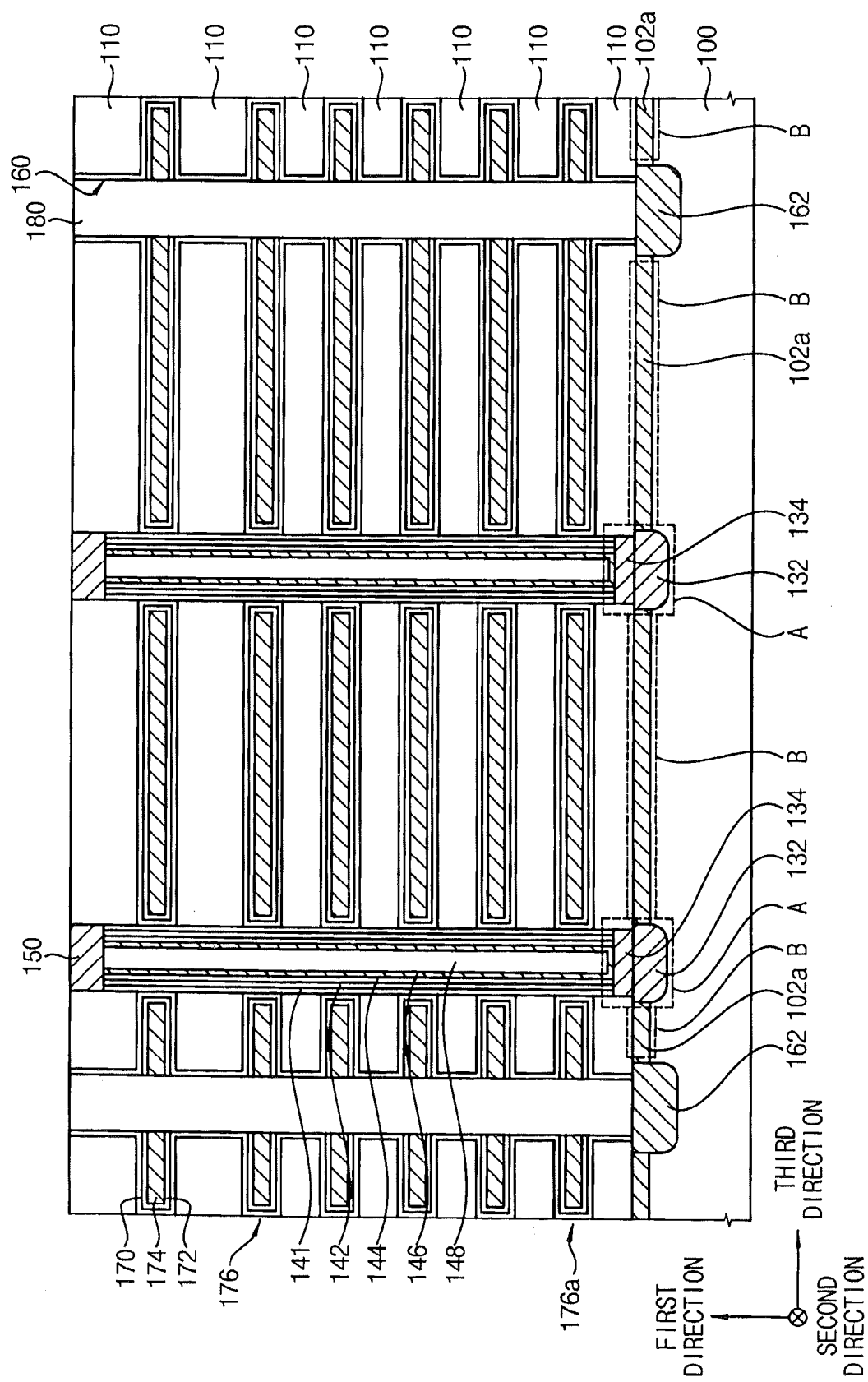
FIG. 2 is a cross-sectional view cut along a line I-I' in FIG. 1.
Figure 3:
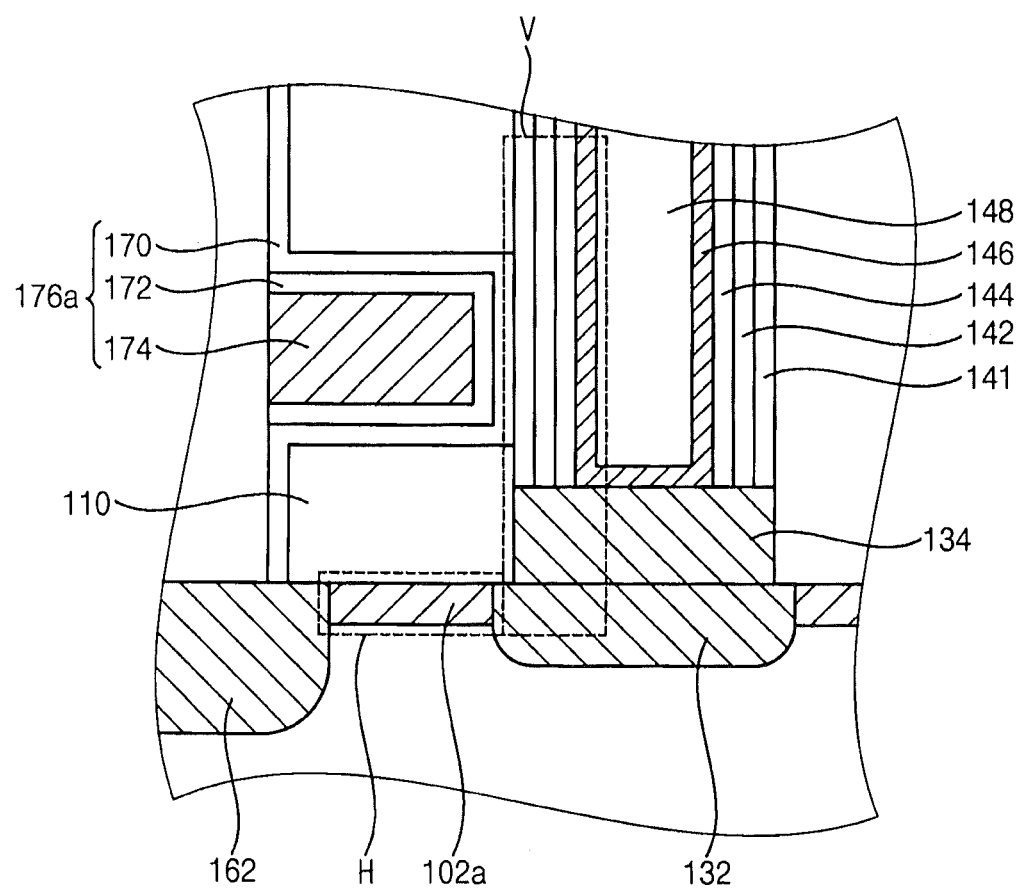
FIG. 3 is an enlarged view of a ground selection transistor of FIG. 2.

FIG. 1 is a plan view illustrating a vertical memory device in accordance with example embodiments. FIG. 2 is a cross-sectional view of the semiconductor device in FIG. 1 cut along the line I-I'. FIG. 3 is an enlarged view of a ground selection transistor (GST) of FIG. 2.

Hereinafter, a direction substantially perpendicular to a top surface of a substrate may be defined as a first direction, and two directions substantially parallel to the top surface of the substrate and substantially perpendicular to each other may be defined as second and third directions, respectively.

Referring to FIGS. 1 to 3, the vertical memory device may include a semiconductor pattern 134 on a substrate 100. In example embodiments, a plurality of semiconductor patterns 134 may be formed both in the second and third directions to define a semiconductor pattern array. A pillar structure including a channel pattern 146 therein may be formed on the semiconductor pattern 134. In example embodiments, a plurality of pillar structures may be formed both in the second and third directions to define a pillar structure array corresponding to the semiconductor pattern array. The pillar structure array may include a plurality of pillar structure columns arranged in the third direction, and each pillar structure column may include a plurality of pillar structures arranged in the second direction. A plurality of gate structures 176 each of which may extend in the second direction and surround sidewalls of the pillar structures may be formed in the first direction.

The semiconductor pattern 134 may be doped with impurities of a first conductive type, and may serve as a first impurity region. A second impurity region 132 doped with impurities of the first conductive type may be formed at an upper portion of the substrate 100 beneath the semiconductor pattern 134. In example embodiments, a plurality of second impurity regions 132 may be formed both in the second and third directions, and second impurity regions 132 may contact the semiconductor patterns 134, respectively.

A third impurity region 162 serving as a common source line (CSL) may be formed at an upper portion of the substrate 100 adjacent to end portions of the gate structures 176. The third impurity region 162 may be spaced apart from the second impurity region 132 in the third direction. In example embodiments, a plurality of third impurity regions 162 each of which may extend in the second direction may be formed in the third direction. The third impurity region 162 may be doped with impurities of a second conductive type different from the first conductive type.

A fourth impurity region 102a may be formed at an upper portion of the substrate 100 between the second and third impurity regions 132 and 162, and also between the second impurity regions 132. In example embodiments, a plurality of fourth impurity regions 102a each of which may extend in the second direction may be formed in the third direction.

The substrate 100 may include a semiconductor material, e.g., silicon, germanium, etc. The substrate 100 may be doped with impurities of the first conductive type at a first impurity concentration, which may be low. For example, the first conductive type may be a p-type.

The semiconductor pattern 134 may contact the top surface of the substrate 100 and may have a pillar shape protruding therefrom in the first direction. The semiconductor pattern 134 may include, e.g., single crystalline silicon. The semiconductor pattern 134 may serve as a channel of the GST.

The first impurity region, i.e., the semiconductor pattern 134 may have a second impurity concentration higher than the first impurity concentration.

The second impurity region 132 may contact the semiconductor pattern 134, and may be doped with impurities of the first conductive type, which may be the same as the semiconductor pattern 134. Thus, the first impurity region and the second impurity region 132 may be electrically connected to each other. The second impurity region 132 may have a third impurity concentration higher than the first impurity concentration. The third impurity concentration may be substantially the same as or different from the second impurity concentration. The second impurity region 132 may have a first depth from the top surface of the substrate 100.

The channel pattern 146 may contact a top surface of the semiconductor pattern 134. The channel pattern 146 may have a hollow cylindrical shape in which a bottom thereof is not open, and may protrude from the top surface of the semiconductor pattern 134. An internal space defined by the hollow cylindrical channel pattern 146 may be filled with a first insulation layer pattern 148. Alternatively, the channel pattern 146 may have a solid cylindrical shape, and thus no first insulation layer pattern may exist. The channel pattern 146 may include doped or undoped polysilicon, single crystalline silicon, etc. Each pillar structure may include a tunnel insulation layer 144, a charge storage layer 142 and an oxide layer 141 sequentially formed on an outer sidewall of the channel pattern 146.

The tunnel insulation layer 144 may surround the outer sidewall of the channel pattern 146. The tunnel insulation layer 144 may include an oxide, e.g., silicon oxide. The charge storage layer 142 may be formed on the tunnel insulation layer 144. The charge storage layer 142 may include a nitride, e.g., silicon nitride. The oxide layer 141 may be formed on the charge storage layer 142. A pad 150 may be disposed on the pillar structure. In example embodiments, a plurality of pads 150 may be formed both in the second and third directions to define a pad array corresponding to the pillar structure array. The pad 150 may include doped or undoped polysilicon, single crystalline silicon, etc. The pad 150 may be electrically connected to the channel pattern 146.

Insulating interlayers 110 may be interposed between the gate structures 176 arranged at different levels in the first direction. That is, the gate structures 176 spaced apart from each other in the first direction may be electrically insulated from each other by the insulating interlayers 110.

In example embodiments, at each level, a plurality of gate structures 176 each of which may extend in the second direction may be formed in the third direction, and the gate structures 176 may be spaced apart from each other by a second insulation layer pattern 180. Each of the gate structures 176 at each level may surround sidewalls of the pillar structures included in the plurality of pillar structure columns. In example embodiments, each of the gate structures 176 at each level may surround sidewalls of the pillar structures included in four pillar structure columns.

Each of the gate structures 176 may include a blocking layer 170, a barrier layer 172 and a metal layer 174. The metal layer 174 may be surrounded by the barrier layer 172 except for one end portion thereof, and the blocking layer 170 may be formed on the barrier layer 172. The metal layer 174 and the barrier layer 172 may serve as a gate electrode of each transistor.

At least one gate structure 176, e.g., a lowermost one of the gate structures 176, hereinafter, may be referred to as a first gate structure 176a, and the gate electrode of the first gate structure 176a may serve as a ground selection line (GSL) of the GST. The other gate structures 176 may be referred to as second gate structures 176.

The first gate structure 176a may face the channel pattern 146 of the pillar structure, and the top surface of the semiconductor pattern 134 may be lower than or substantially coplanar with a bottom surface of the first gate structure 176a.

The blocking layer 170 may have silicon oxide or a metal oxide having a high dielectric constant. For example, the metal oxide may include aluminum oxide, hafnium oxide, lanthanum oxide, lanthanum aluminum oxide, lanthanum hafnium oxide, hafnium aluminum oxide, titanium oxide, tantalum oxide, zirconium oxide, etc.

The gate electrode of the second gate structures 176 may serve as a word line or a string selection line (SSL). Particularly, at least one of the second gate structures 176, e.g., an uppermost one of the second gate structures 176 may include the gate electrode serving as the SSL. The barrier layer 172 may include a conductive metal nitride, e.g., titanium nitride, tantalum nitride, etc. The metal layer 174 may include a metal having a low resistance, e.g., tungsten, titanium, platinum, etc.

The third impurity region 162 serving as the CSL may have a low resistance, and may have a high impurity concentration. The third impurity region 162 may have a second depth from the top surface of the substrate 100.

The fourth impurity region 102a may serve as a portion of a horizontal channel of the GST. The fourth impurity region 102a may have a fourth impurity concentration lower than the second and third impurity concentrations. That is, the fourth impurity region 102a denoted by reference mark B in FIG. 2 may have an impurity concentration lower than those of the first and second impurity regions 134 and 132 denoted by reference mark A in FIG. 2.

The fourth impurity region 102a may have a third depth from the top surface of the substrate 100. The third depth may be smaller than the first and second depths. The fourth impurity region 102a may be formed between the second and third impurity regions 132 and 162 or between the second impurity regions 132.

The fourth impurity region 102a may have impurities of the first conductive type or the second conductive type. When the fourth impurity region 102a includes impurities of the second conductive type, the fourth impurity region 102a may have an impurity concentration lower than that of the third impurity region 162.

A portion of the channel pattern 146 adjacent to the first gate structure 176a, the semiconductor pattern 134, and a portion of the substrate 100 adjacent to the first gate structure 176a, i.e., the second and fourth impurity regions 132 and 102a may serve as a channel of the GST. The GST may be a negative-channel metal oxide semiconductor (NMOS) transistor or a positive-channel metal oxide semiconductor (PMOS) transistor, however, for the convenience of explanations, only the case in which the GST is an NMOS transistor will be illustrated.

The GST may include a first channel and a second channel, which may be a vertical channel region V and a horizontal channel region H, respectively. The vertical channel region V may include the portion of the channel pattern 146 adjacent to the first gate structure 176a, the semiconductor pattern 134 and a portion of the second impurity region 132 adjacent to the first gate structure 176a, and the horizontal channel region H may include the fourth impurity region 102a. An end portion of the second channel may contact the third impurity region 162 serving as the CSL. The first and second channels may be connected in series to each other.

As described above, the first and second impurity regions 134 and 132 of the first channel may have the second and third impurity concentrations, respectively. The fourth impurity region 102a of the second channel may have the fourth impurity concentration lower than the second and third impurity concentrations.

In example embodiments, the fourth impurity region 102a may be doped with n-type impurities at a low concentration. In this case, the second channel may have the same conductive type as that of the third impurity region 162 serving as the CSL, and thus may be electrically connected thereto.

In example embodiments, the fourth impurity region 102a may be doped with p-type impurities at a low concentration. In this case, a horizontal transistor including the second channel may have a lower threshold voltage, thereby serving as a pass transistor.

As illustrated in FIGS. 1 and 2, each gate structure 176 may surround the sidewalls of the pillar structures in the plurality of pillar structure columns arranged in the third direction. The length of the second channel may be varied depending on the location of the pillar structures. For example, a first channel length CL1 of the second channel of a first GST including the channel pattern 146 of the pillar structure in a first pillar structure column counted from the CSL may be shorter than a second channel length CL2 of the second channel of a second GST including the channel pattern 146 of the pillar structure in a second pillar structure column counted from the CSL. The first and second GSTs may have different on-currents from each other due to the channel length difference, e.g., the difference between first and second channel lengths CL1 and CL2, and thus the characteristic distribution of memory cells may occur.

However, in accordance with example embodiments, the fourth impurity region 102a of the horizontal channel region H may be doped with impurities having the fourth impurity concentration lower than the second and third impurity concentrations, and thus the horizontal transistor may have a low threshold voltage or the fourth impurity region 102a may be electrically connected to the CSL. Thus, the characteristic distribution of the memory cell due to the channel length difference in the GST may be reduced.

In a vertical transistor including the first channel, currents may flow in the vertical direction, and in the horizontal transistor including the second channel, currents may flow in the horizontal direction. Therefore, the direction of the currents may be changed by about 90 degrees at a portion connecting the vertical and horizontal transistors, which may reduce the mobility of the electrons.

However, in accordance with example embodiments, the second impurity region 132 doped with impurities at the third concentration higher than the first concentration of the substrate 100 may be formed at the upper portion of the substrate 100 contacting the semiconductor pattern 134, which may reduce the decrease of the mobility of the electrons.

The second insulation layer pattern 180 filling an opening 160 through the insulating interlayers 110 and the first and second gate structures 176a and 176 may be formed on the third impurity region 162. End portions of the first and second gate structures 176a and 176 may contact sidewalls of the second insulation layer pattern 180.

In example embodiments, a metal silicide pattern such as a cobalt silicide pattern or a nickel silicide pattern may be further formed on the third impurity region 162. The metal silicide pattern on the third impurity region 162 may also serve as the CSL together with the third impurity region 162.

A bit line may be formed over the pads 150, and may be electrically connected to the pads 150 via bit line contacts. Accordingly, the bit line may be electrically connected to the channel patterns 146. The bit line may include a metal, a metal nitride, doped polysilicon, etc.

The shape and structure of the pillar structure and the gate structure may not be limited herein. In example embodiments, the gate structure 176 may include a tunnel insulation layer, a charge storage layer, a blocking layer, a barrier layer and a metal layer sequentially stacked, and in this case, the pillar structure may include only a channel pattern and the first insulation layer pattern 148 filling the internal space defined by the channel pattern.

FIGS. 4 to 9 are cross-sectional views illustrating stages of a method of manufacturing the vertical memory device of FIGS. 1 to 3.

Figure 4:
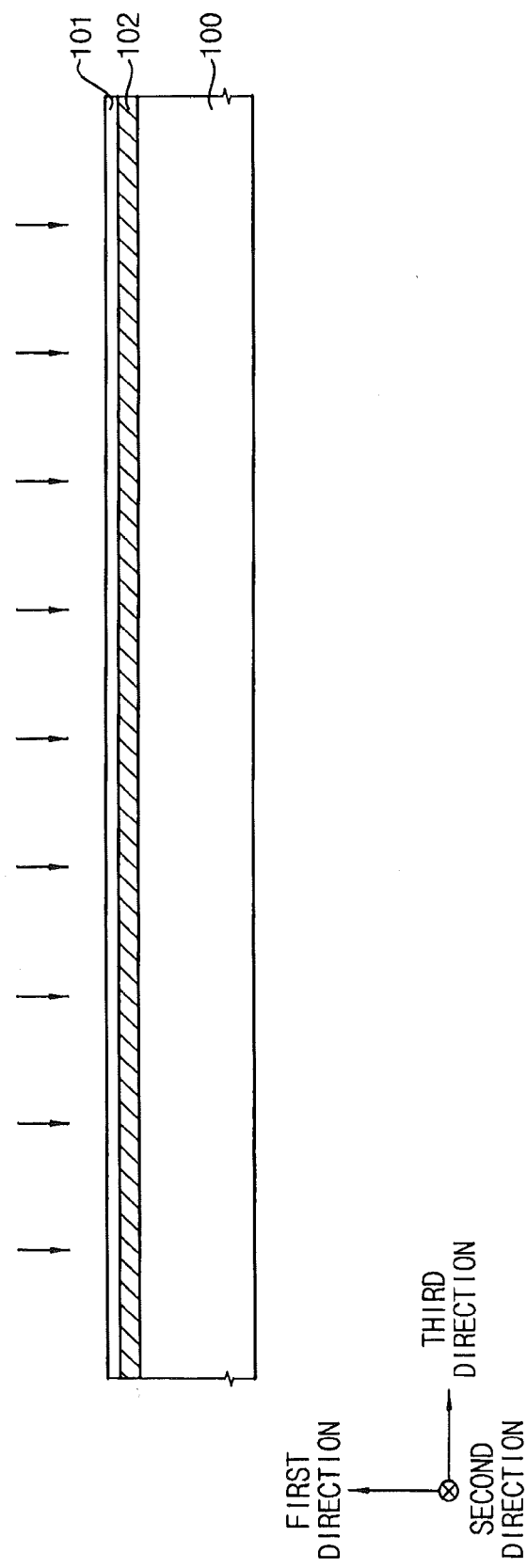
FIGS. 4 to 9 are cross-sectional views illustrating stages of a method of manufacturing the vertical memory device of FIGS. 1 to 3.

Referring to FIG. 4, a pad layer 101 may be formed on a substrate 100.

The substrate 100 may include a semiconductor material, e.g., silicon or germanium. The substrate 100 may be doped with impurities of a first conductive type at a first impurity concentration. In example embodiments, the substrate 100 may be doped with p-type impurities at the first impurity concentration.

The pad layer 101 may be formed to reduce a damage of an upper portion of the substrate 100 by an ion implantation process, however, in some cases, the process for forming the pad layer 101 may be skipped.

Impurities may be implanted into the substrate 100 by an ion implantation process at a fourth impurity concentration to form a preliminary fourth impurity region 102 at an upper portion of the substrate 100. The impurities may have the first conductive type or a second conductive type. The preliminary fourth impurity region 102 may have a third depth from a top surface of the substrate 100.

After the ion implantation process is performed, the pad layer 101 on the substrate 100 may be removed.

Figure 5:
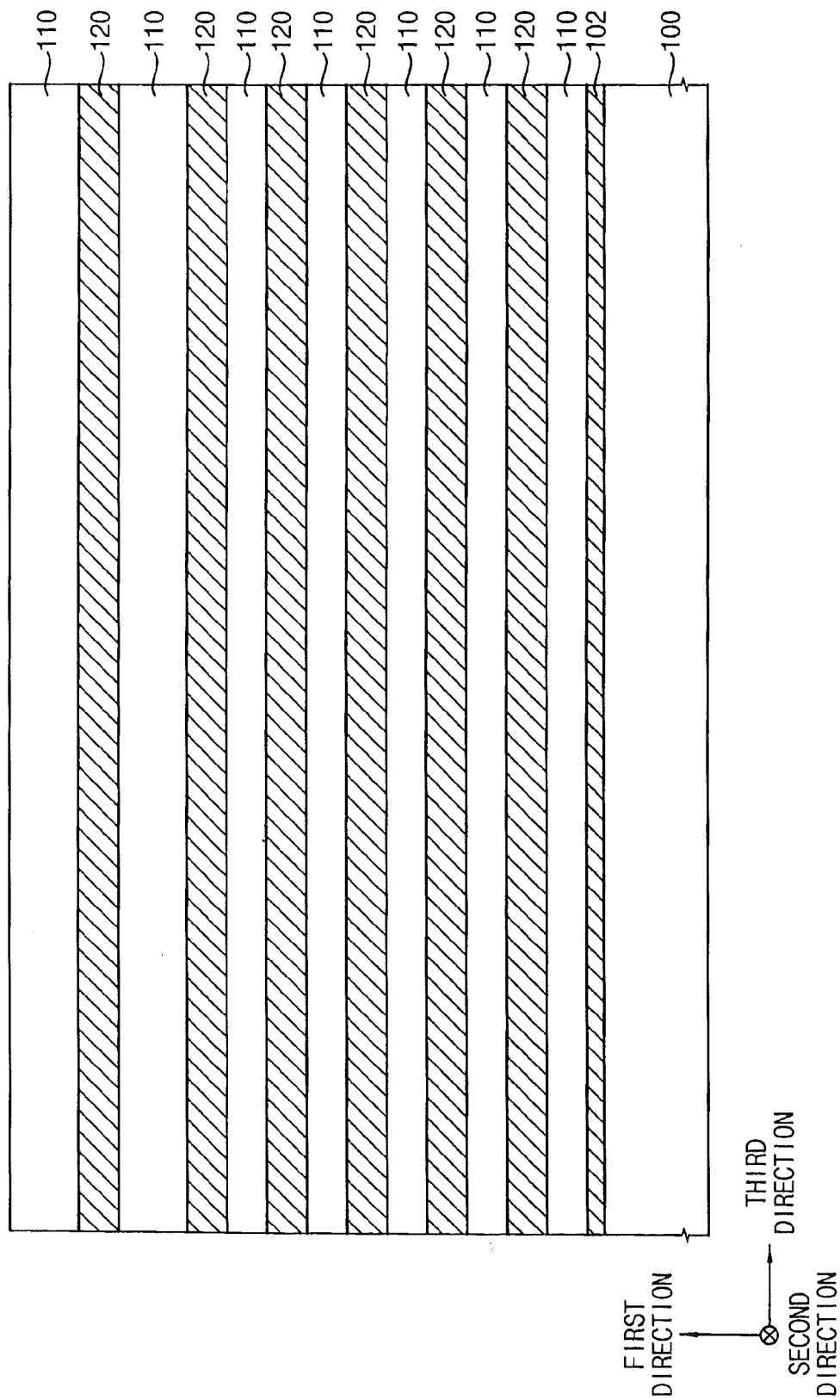

Referring to FIG. 5, an insulating interlayer 110 and a sacrificial layer 120 may be alternately and repeatedly stacked on the substrate 100. The insulating interlayers 110 and the sacrificial layers 120 may be formed by a chemical vapor deposition (CVD) process, a plasma enhanced chemical vapor deposition (PECVD) process or an atomic layer deposition (ALD) process. The insulating interlayers 110 may be formed using, e.g., silicon oxide, and the sacrificial layers 120 may be formed using a material having an etching selectivity with respect to the insulation layers 110, e.g., silicon nitride.

A gate electrode of each transistor may be formed in the sacrificial layer 120 at each level by a subsequent process. In particular, a gate electrode for an SSL may be formed in at least one of the sacrificial layers 120, e.g., an uppermost one of the sacrificial layers 120. A gate electrode for a GSL may be formed in at least one of the sacrificial layers 120, e.g., a lowermost layer of the sacrificial layers 120. Gate electrodes for word lines may be formed in the other sacrificial layers 120, e.g., central ones of the sacrificial layers 120. The numbers of the insulating interlayers 110 and the sacrificial layers 120 may be varied in accordance with the number of the transistors stacked in the first direction.

Figure 6:
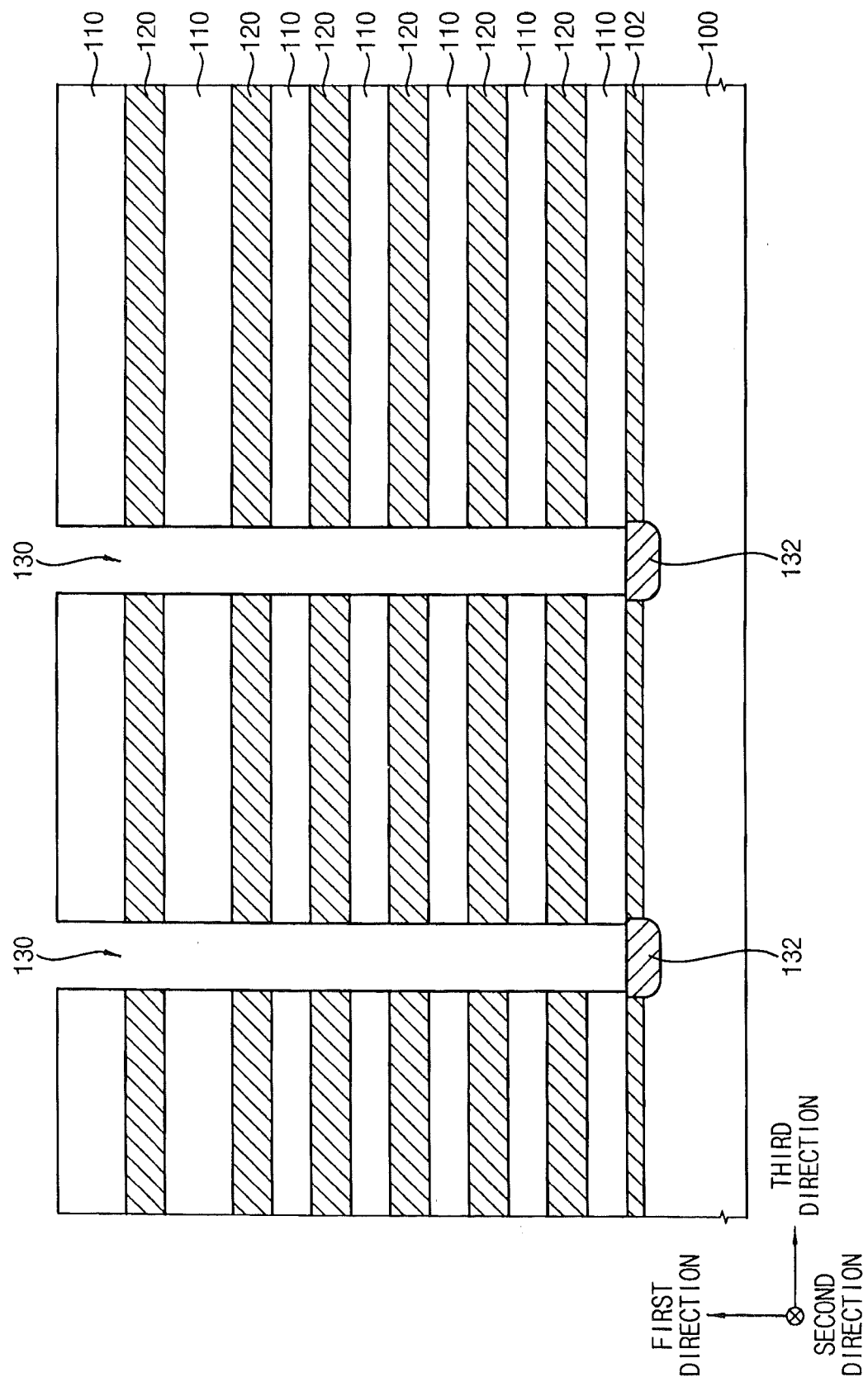

Referring to FIG. 6, a plurality of channel holes 130 may be formed through the insulating interlayers 110 and the sacrificial layers 120 in the second and third directions to define a channel hole array. Each of the channel holes 130 may be formed to expose a top surface of the substrate 100. The channel holes 130 may be formed by a dry etching process using a hard mask as an etching mask. Due to characteristics of the dry etching process, the channel holes 130 may have a width that becomes gradually smaller from a top portion to a bottom portion thereof.

Impurities of the first conductive type may be implanted into the exposed top surfaces of the substrate 100 by the channel holes 130 through an ion implantation process to form a plurality of second impurity regions 132. The second impurity regions 132 may have a first depth from the top surface of the substrate 100. When the first conductive type is a p-type, the implanted impurities may include boron (B).

In example embodiments, for the simplicity of the processes, after the channel holes 130 are formed, the ion implantation process for forming the second impurity region 132 may not be performed but skipped. In this case, the ion implantation process for forming the second impurity region 132 may be subsequently performed.

Figure 7:
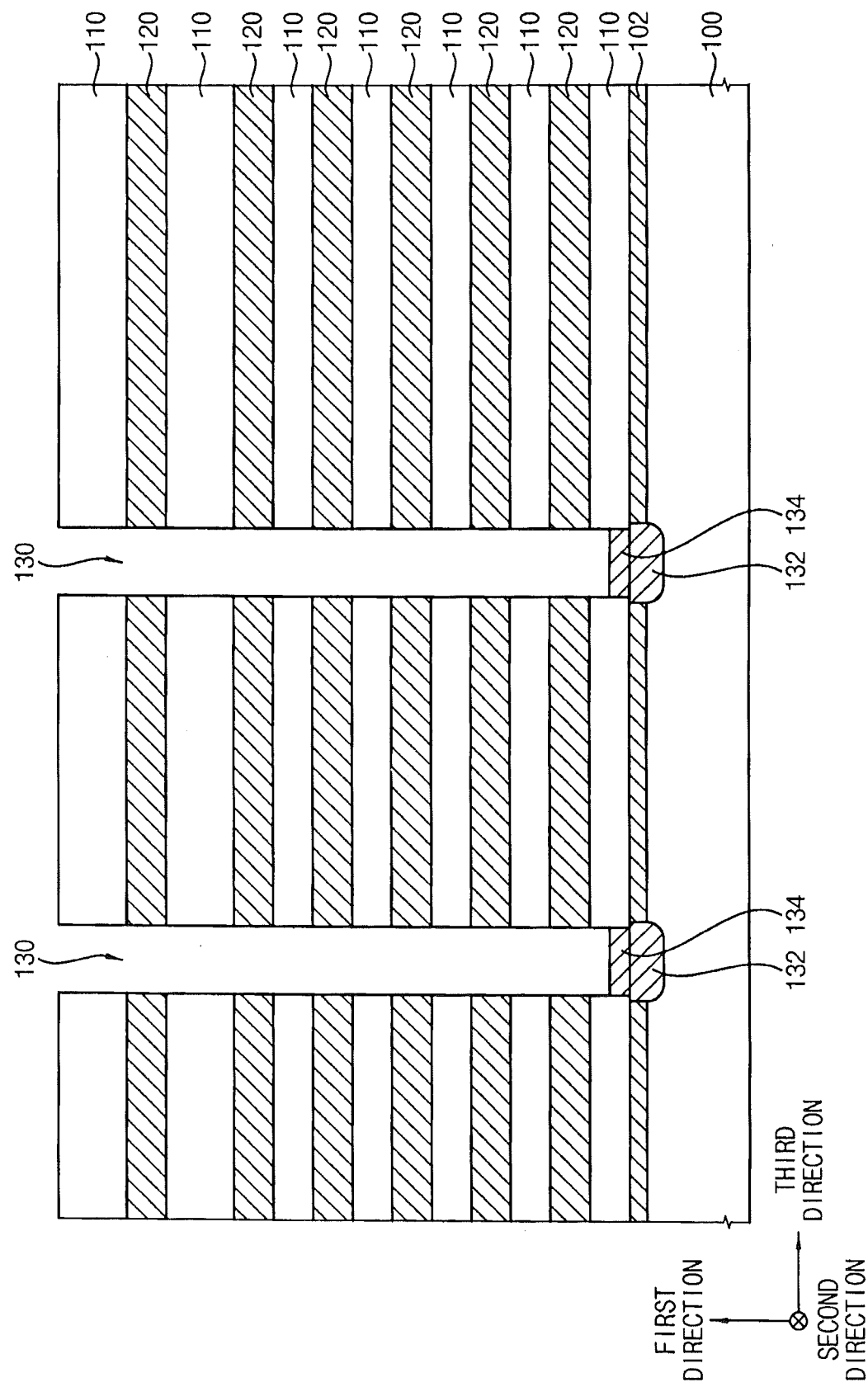

Referring to FIG. 7, a semiconductor pattern 134 may be formed to fill a lower portion of each channel hole 130, and thus a plurality of semiconductor patterns 134 may be formed both in the second and third directions in the channel holes 130, respectively. In particular, the semiconductor patterns 134 may be formed by a selective epitaxial growth (SEG) process using the exposed top surfaces of the substrate 100 as a seed layer. The semiconductor patterns 134 may include single crystalline silicon or single crystalline germanium. The semiconductor patterns 134 may serve as channels of vertical transistors of ground selection transistors (GST).

In example embodiments, a top surface of the semiconductor pattern 134 may be formed to be lower than or substantially coplanar with a bottom surface of the lowermost sacrificial layer 120.

In example embodiments, in the SEG process for forming the semiconductor patterns 134, impurities of the first conductive type may be doped, so that first impurity regions doped with the first conductive type impurities may be formed in the semiconductor patterns 134, respectively. That is, an additional ion implantation process for forming the first impurity regions may not be needed. The first impurity regions may have a second impurity concentration higher than the first impurity concentration.

Alternatively, after the SEG process for forming the semiconductor patterns 134, the semiconductor patterns 134 may be doped with impurities of the first conductive type to form the first impurity regions. That is, an additional ion implantation process for forming the first impurity regions may be performed. In an example embodiment, the SEG process and the ion implantation process may be performed in-situ. The first impurity regions may have the second impurity concentration higher than the first impurity concentration. When the first conductive type is a p-type, the doped impurities may include boron.

In the process illustrated with reference to FIG. 6, when the ion implantation process for forming the second impurity regions 132 has not been performed, upper portions of the substrate 100 beneath the semiconductor patterns 134 may be doped with impurities when the first impurity regions are formed, so that the first and second impurity regions may be formed simultaneously.

Figure 8:
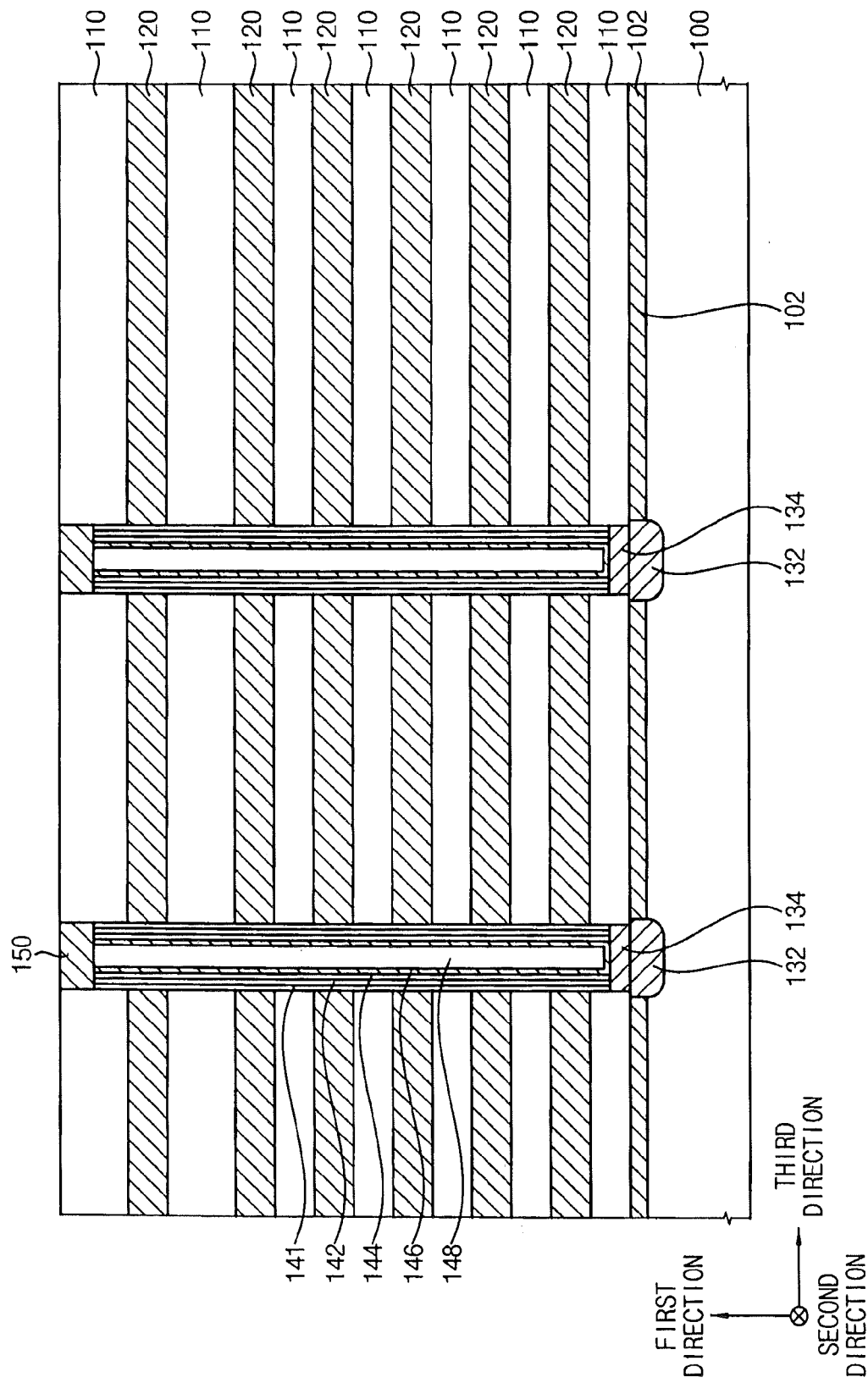

Referring to FIG. 8, an oxide layer 141, a charge storage layer 142, a tunnel insulation layer 144 and a first polysilicon layer may be formed sequentially on an inner sidewall of each channel hole 130 and a top surface of each semiconductor pattern 134. A silicon oxide layer or a silicon nitride layer for protecting the first polysilicon layer may be further formed on the first polysilicon layer.

The charge storage layer 142 may be formed to include a nitride, e.g., silicon nitride. The tunnel insulation layer 144 may be formed to include an oxide, e.g., silicon oxide.

Lower portions of the oxide layer 141, the charge storage layer 142, the tunnel insulation layer 144 and the first polysilicon layer may be etched to expose a top surface of each semiconductor pattern 134, so that the first polysilicon layer, the tunnel layer 144, the charge storage layer 142 and the oxide layer 141 may remain only on the sidewall of each channel hole 130. If the silicon oxide layer or the silicon nitride layer is previously formed on the first polysilicon layer, the silicon oxide layer or the silicon nitride layer may be removed in the etching process.

A second polysilicon layer may be formed on the first polysilicon layer and each semiconductor pattern 134. The first and the second polysilicon layers may serve as a channel pattern 146. The channel pattern 146 may have a hollow cylindrical shape in which a bottom is not open, and the bottom of the channel pattern 146 may contact each semiconductor pattern 134.

A first insulation layer may be formed using, e.g., silicon oxide, to sufficiently fill the channel holes 130, and an upper portion of the first insulation layer may be planarized until a top surface of the uppermost insulating interlayer 110 may be exposed to form first insulation patterns 148.

Upper portions of the first insulation layer patterns 148, the oxide layer 141, the charge storage layer 142, the tunnel insulation layer 144 and the channel pattern 146 in each channel hole 130 may be removed to form a recess and a pillar structure in each channel hole 130. A polysilicon layer may be formed to fill the recesses, and an upper portion of the polysilicon layer may be planarized until a top surface of the insulating interlayer 110 may be exposed to form a plurality of pads 150 on the pillar structures, respectively.

Figure 9:
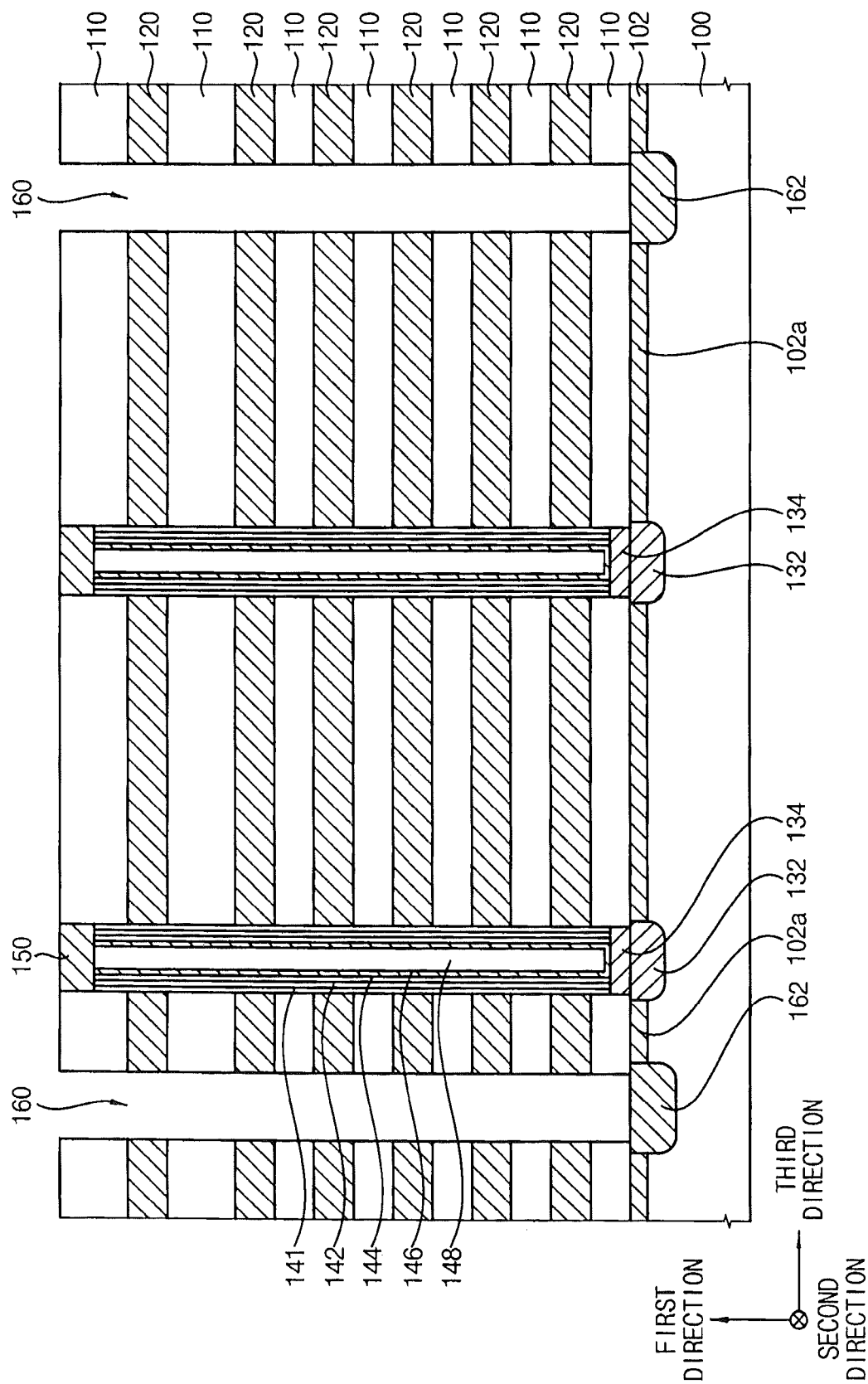

Referring to FIG. 9, an opening 160 may be formed through the insulating interlayers 110 and the sacrificial layers 120 to expose a top surface of the substrate 100. In example embodiments, a plurality of openings 160 each of which may extend in the second direction may be formed in the third direction.

A third impurity region 162 may be formed by implanting impurities of the second conductive type into the exposed top surface of the substrate 100 by each opening 160. In example embodiments, the third impurity region 162 may be formed by implanting N-type impurities at a high concentration. The third impurity region 162 may have a second depth from the top surface of the substrate 100. The second depth may be greater than the third depth.

The third impurity region 162 may serve as the CSL. The preliminary fourth impurity region 102 may be transformed into a fourth impurity region 102a of which both end portions may contact the second and third impurity regions 132 and 162. The fourth impurity region 102a may be arranged between the second and third impurity regions 132 and 162 or between the second impurity regions 132.

For example, a metal silicide pattern, e.g., a cobalt silicide pattern or a nickel silicide pattern, may be further formed on the third impurity region 162.

Referring to FIG. 2 again, the sacrificial layers 120 exposed by the openings 160 may be removed to form a plurality of gaps between the insulating interlayers 110. In example embodiments, a wet etching process using an etching solution having a high etching selectivity with respect to the insulating interlayers 110 may be performed to remove the sacrificial layers 120. The etching solution may include phosphoric acid.

A blocking layer 170 may be formed on an inner wall of each gap and sidewalls of the openings 160. The blocking layer 170 may be formed to include silicon oxide or a metal oxide having a high dielectric constant, e.g., aluminum oxide, hafnium oxide, lanthanum oxide, lanthanum aluminum oxide, lanthanum hafnium oxide, hafnium aluminum oxide, titanium oxide, tantalum oxide, zirconium oxide, etc.

A barrier layer 172 may be formed on the blocking layer 170. A metal layer 174 may be formed to fill a remaining portion of each gap. The barrier layer 172 may be formed to include a metal nitride, e.g., titanium nitride or tantalum nitride. The metal layer 174 may be formed to include a low resistance metal, e.g., tungsten, titanium, tantalum, platinum, etc.

Portions of the metal layer 174 and the barrier layer 172 on sidewalls of the openings 160 may be removed to form a plurality of gate structures 176. The removing process may include a wet etching process.

A second insulation layer pattern 180 may be formed to fill each opening 160. An upper insulating interlayer may be formed on the first insulating interlayers 110, the pads 150, the second insulation patterns 180 and the blocking layer 170, and contact holes may be formed through the upper insulating interlayer to expose top surfaces of the pads 150. A plurality of bit line contacts may be formed in the contact holes. A bit line contacting the bit line contact may be formed.

According to the above processes, the vertical memory device having the reduced characteristic distribution and the increased cell currents may be manufactured.

Figure 10:
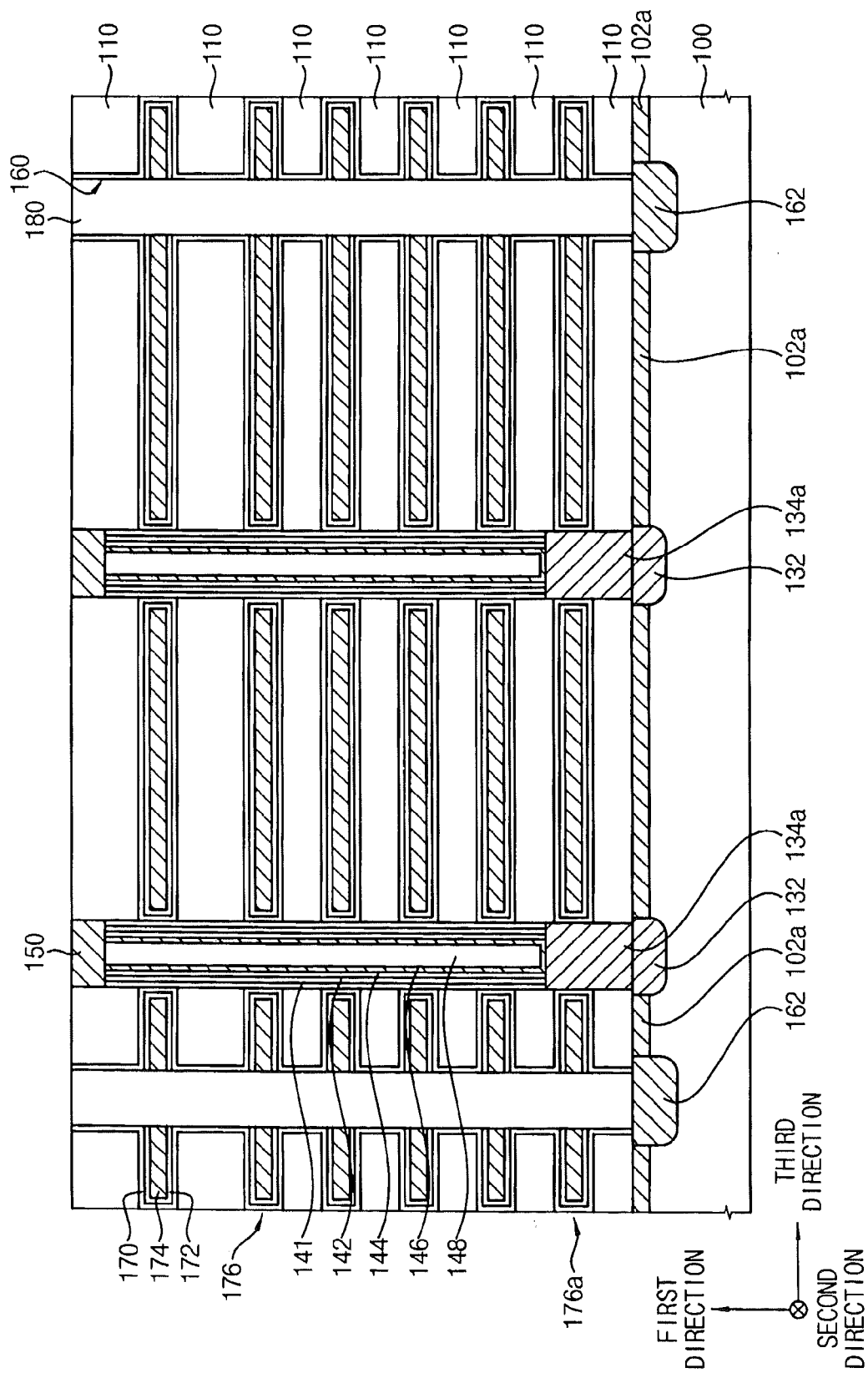
FIG. 10 is a cross-sectional view illustrating a vertical memory device.
Figure 11:
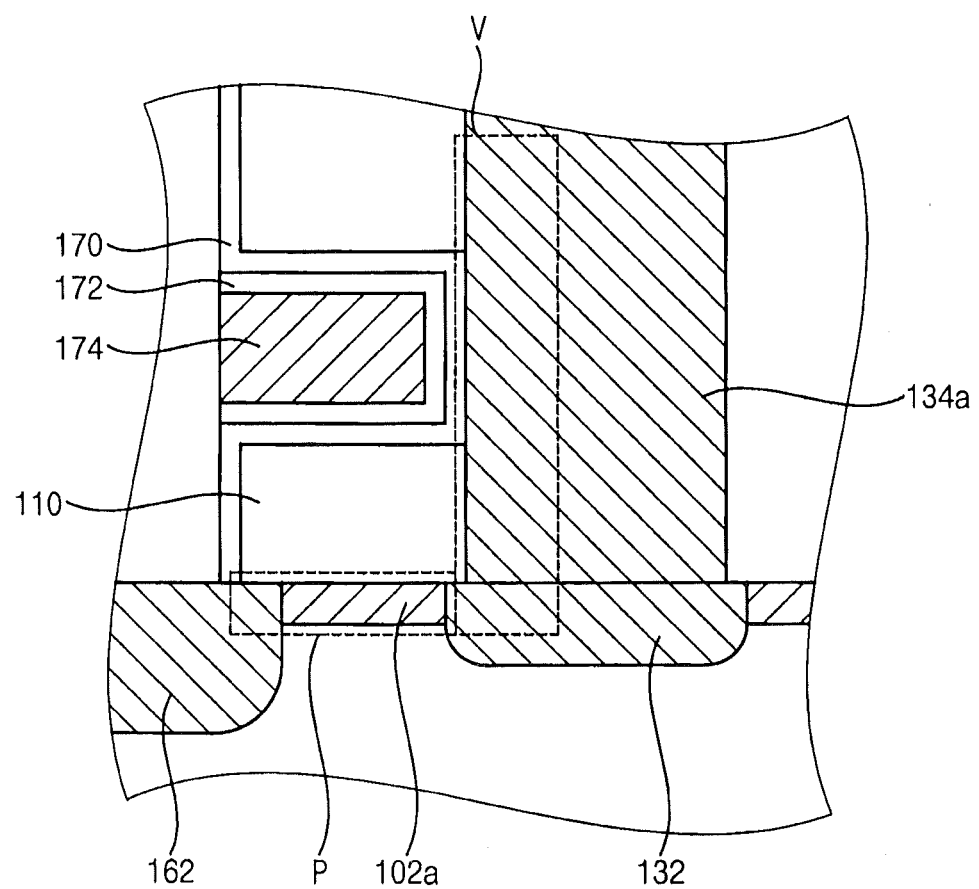
FIG. 11 is an enlarged view of a ground transistor of FIG. 10.

FIG. 10 is a cross-sectional view illustrating a vertical memory device in accordance with example embodiments. FIG. 11 is an enlarged view of a ground selection transistor (GST) of FIG. 10.

This vertical memory device may be substantially the same as that of FIGS. 1 to 3 except for the shape of the semiconductor pattern. Thus, like reference numerals refer to like elements, and detailed explanations thereon are omitted herein.

Referring to FIGS. 10 and 11, a substrate 100 may be doped with impurities of a first conductive type at a first concentration, which may be low.

A semiconductor pattern 134a may contact a top surface of the substrate 100 and may have a pillar shape protruding therefrom in the first direction. The semiconductor pattern 134a may include, e.g., single crystalline silicon. The semiconductor pattern 134a may serve as a channel of the GST. In example embodiments, a channel pattern 146 of a pillar structure may not serve as a channel of the GST. The semiconductor pattern 134a may serve as a first impurity region. The first impurity region may have a second impurity concentration higher than the first impurity concentration. For example, the first impurity region may be doped with p-type impurities.

A second impurity region 132 may contact the semiconductor pattern 134a, and may be doped with impurities of the first conductive type, which may be the same as the semiconductor pattern 134a. Thus, the first impurity region and the second impurity region 132 may be electrically connected to each other. The second impurity region 132 may have a third impurity concentration higher than the first impurity concentration. The third impurity concentration may be substantially the same as or different from the second impurity concentration. The second impurity region 132 may have a first depth from the top surface of the substrate 100.

A pillar structure may be formed on the semiconductor pattern 134a. The pillar structure may be substantially the same as that of the pillar structure of FIG. 1.

In example embodiments, a plurality of pillar structures may be formed both in the second and third directions. A plurality of gate structures 176 each of which may extend in the second direction and surround sidewalls of the pillar structures may be formed in the first direction. Insulating interlayers 110 may be interposed between the gate structures 176 arranged at different levels in the first direction. That is, the gate structures 176 spaced apart from each other in the first direction may be electrically insulated from each other by the insulating interlayers 110. Each of the gate structures 176 at each level may surround sidewalls of the pillar structures included in the plurality of pillar structure columns.

At least one gate structure 176, e.g., a lowermost one of the gate structures 176 may be referred to as a first gate structure 176a, and the gate electrode of the first gate structure 176a may serve as a ground selection line of the GST. The other gate structures 176 may be referred to as second gate structures 176.

The first gate structures 176a may extend in the second direction and surround sidewalls of the semiconductor patterns 134a. The second gate structures 176 may extend in the second direction and surround sidewalls of the pillar structures. A top surface of the semiconductor pattern 134a may be higher than or substantially coplanar with a top surface of the first gate structure 176a.

A third impurity region 162 serving as a common source line (CSL) may be formed at an upper portion of the substrate 100 adjacent to end portions of the gate structures 176. The third impurity region 162 may be doped with impurities of a second conductive type at a high concentration, and may have a second depth from the top surface of the substrate 100.

A fourth impurity region 102a may be formed at upper portions of the substrate 100 between the second and third impurity regions 132 and 162, and also between the second impurity regions 132. The fourth impurity region 102a may have a fourth impurity concentration lower than the second and third impurity concentration. The fourth impurity region 102a may have a third depth from the top surface of the substrate 100. The third depth may be smaller than the first and second depth.

The fourth impurity region 102a may have impurities of the first conductive type or the second conductive type. The second, third and fourth impurity region 132, 162 and 102a may be substantially the same as those in FIG. 1.

The GST may include a first channel and a second channel, which may be a vertical channel region V and a horizontal channel region H, respectively. The first and second channels may be connected in series to each other. The fourth impurity region 102a serving as the horizontal channel region H may be electrically connected to the CSL, or a horizontal transistor including the horizontal channel region H may have a turn-on status. Thus, the characteristic distribution of the memory cell due to the channel length difference in the GST may be reduced.

The second impurity region 132 may be formed at the upper portion of the substrate 100 contacting the semiconductor pattern 134a, which may increase on-currents of the GST.

Figure 12:
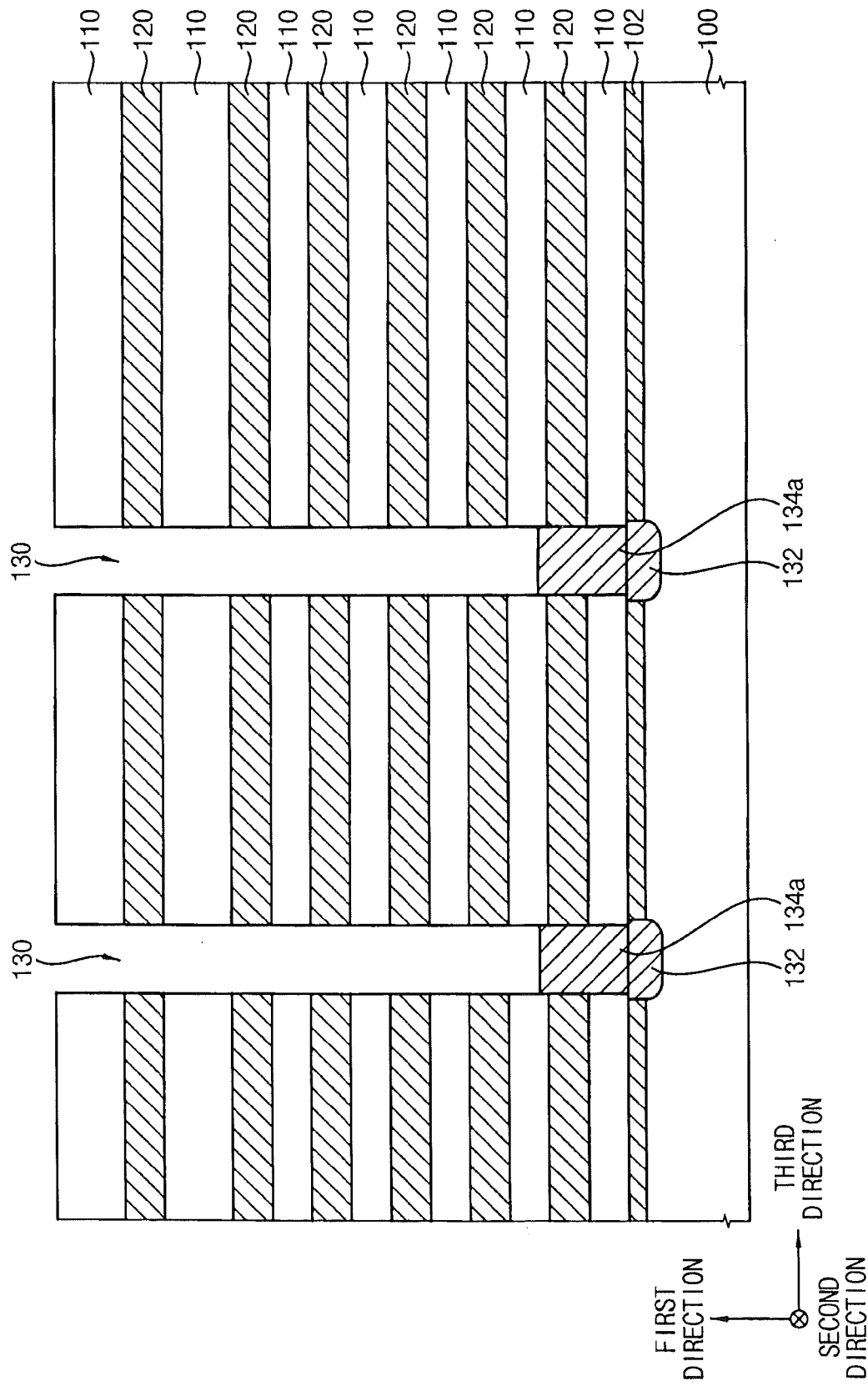
FIGS. 12 and 13 are cross-sectional views illustrating stages of a method of manufacturing the vertical memory device of FIG. 10.
Figure 13:
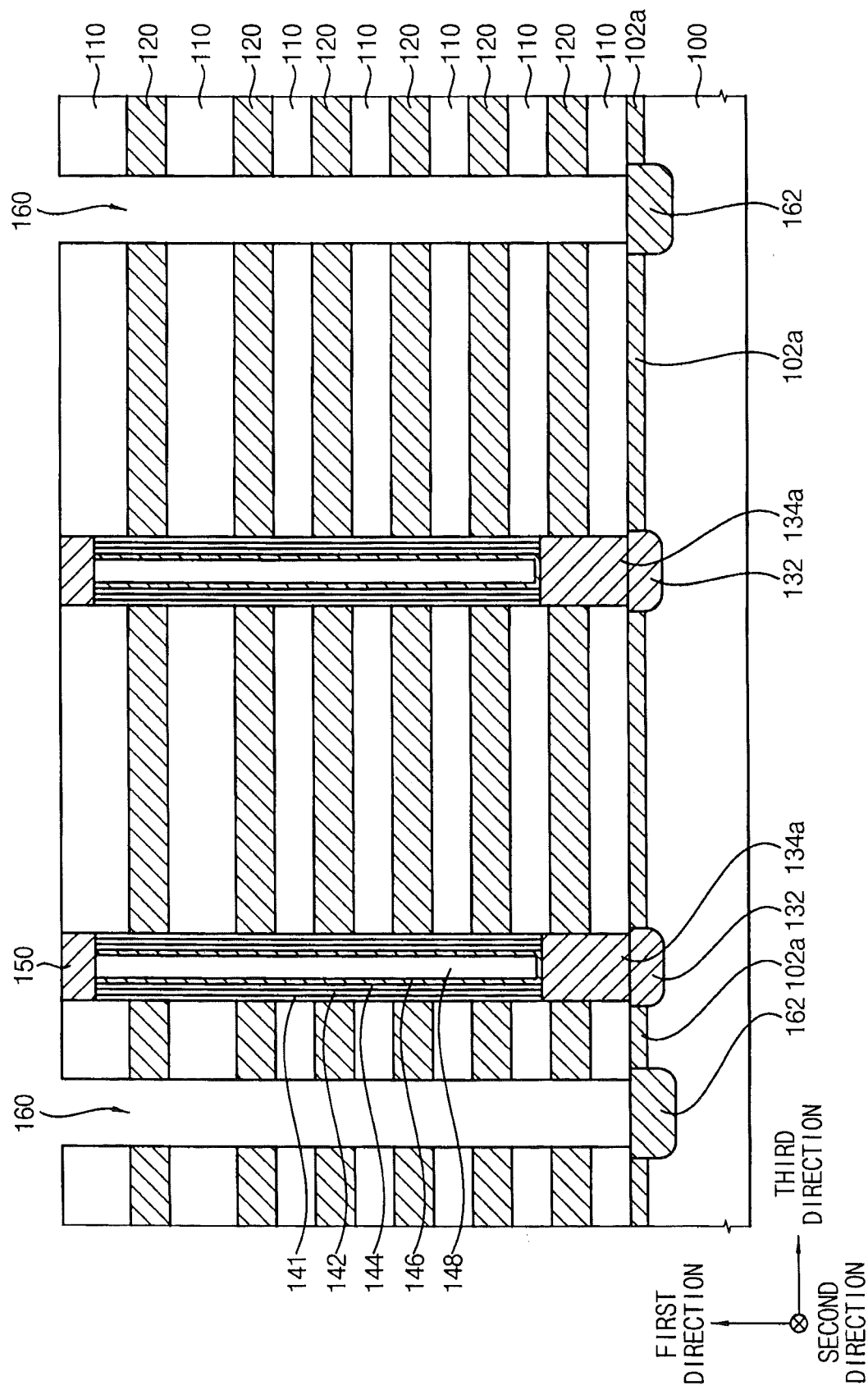

FIGS. 12 and 13 are cross-sectional views illustrating stages of a method of manufacturing the vertical memory device of FIG. 10.

This method of manufacturing the vertical memory device may be substantially the same as that illustrated with reference to FIGS. 4 to 9 except for the process for forming the semiconductor pattern.

Processes substantially the same as or similar to those illustrated with reference to FIGS. 4 to 6 may be performed to form second impurity regions 132 and channel holes 130 in FIG. 6.

Referring to FIG. 12, a semiconductor pattern 134a filling a lower portion of each channel hole 130 may be formed. In example embodiments, a top surface of the semiconductor pattern 134a may be higher than or substantially coplanar with a top surface of a lowermost sacrificial layer 120. A first impurity region may be formed in the semiconductor pattern 134a. The first impurity region may have a second impurity concentration higher than a first impurity concentration.

Processes for forming the semiconductor pattern 134a and the first impurity region may be substantially the same as those illustrated with reference to FIG. 7. In example embodiments, in the SEG process for forming the semiconductor patterns 134a, impurities of the first conductive type may be doped, so that first impurity regions doped with the first conductive type impurities may be formed in the semiconductor patterns 134a, respectively. That is, an additional ion implantation process for forming the first impurity regions may not be needed. The first impurity regions may have a second impurity concentration higher than the first impurity concentration.

Alternatively, after the SEG process for forming the semiconductor patterns 134a, the semiconductor patterns 134a may be doped with impurities of the first conductive type to form the first impurity regions. That is, an additional ion implantation process for forming the first impurity regions may be performed. In an example embodiment, the SEG process and the ion implantation process may be performed in-situ. The first impurity regions may have the second impurity concentration higher than the first impurity concentration. When the first conductive type is a p-type, the doped impurities may include boron.

Referring to FIG. 13, a pillar structure may be formed in each channel hole 130. Processes for formation of the pillar structure may be substantially the same as those illustrated with reference to FIG. 8.

An opening 160 may be formed through the insulating interlayers 110 and the sacrificial layers 120 to expose a top surface of the substrate 100. In example embodiments, a plurality of openings 160 each of which may extend in the second direction may be formed in the third direction.

A third impurity region 162 may be formed by implanting impurities of the second conductive type into the substrate 100 exposed by each opening 160. The third impurity region 162 may be formed to serve as the CSL. A preliminary fourth impurity region 102 may be transformed into a fourth impurity region 102a. The fourth impurity region 102a may contact end portions of the second and third impurity regions 132 and 162, and may be arranged between the second and third impurity regions 132 and 162 or between the second impurity regions 132. Processes for formation of the opening 160 and the third impurity region 162 may be substantially the same as those illustrated with reference to FIG. 9.

By performing subsequent processes illustrated with reference to FIG. 2, the vertical memory device in FIG. 10 may be manufactured.

Figure 14:
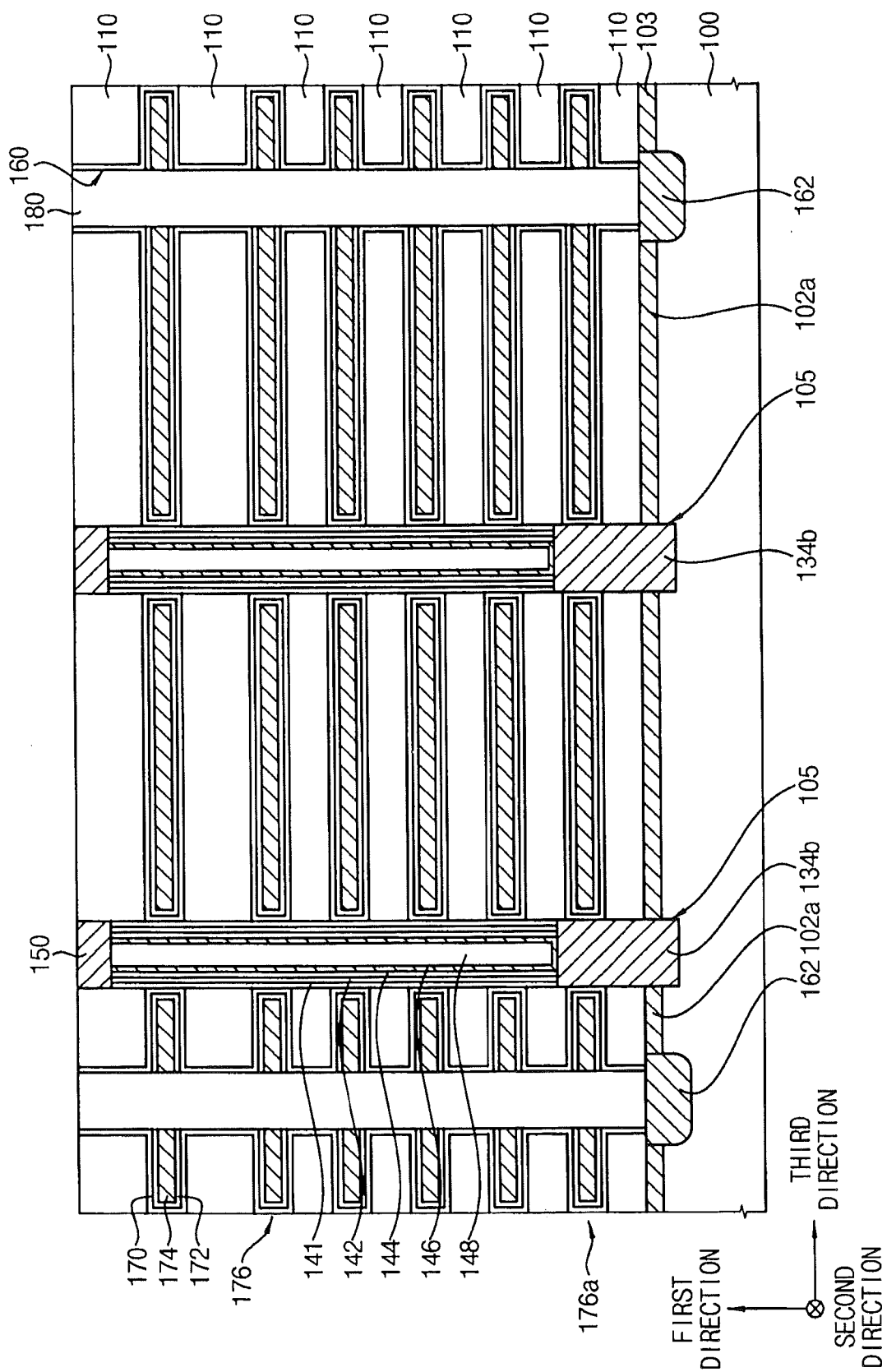
FIG. 14 is a vertical memory device in accordance with example embodiments.

FIG. 14 is a cross-sectional view illustrating a vertical memory device in accordance with example embodiments.

This vertical memory device may be substantially the same as that of FIGS. 10 and 11 except for a semiconductor pattern and an impurity region formed in the semiconductor pattern and a substrate. Thus, like reference numerals refer to like elements, and detailed explanations thereon are omitted herein.

Referring to FIG. 14, a substrate 100 may be doped with impurities of a first conductive type at a first concentration, which may be low. An upper portion of the substrate 100 at which a semiconductor pattern 134b may be formed, may be recessed with a first depth.

The semiconductor pattern 134b protruding from a top surface of the substrate 100 may fill a recess 105 of the substrate 100. A bottom surface of the semiconductor pattern 134b may be lower than the top surface of the substrate 100. The semiconductor pattern 134b may have a sidewall that may not be perpendicular to the top surface of the substrate 100 but slanted thereto. Therefore, a boundary between the sidewalls of the semiconductor pattern 134b contacting the recess 105 and the semiconductor pattern 134b not contacting the recess 105 may be formed.

The semiconductor pattern 134b may include, e.g., single crystalline silicon. The semiconductor pattern 134b may serve as a channel of the GST. In example embodiments, a channel pattern 146 of a pillar structure may not serve as a channel of the GST. A first impurity region may be formed at the semiconductor pattern 134b. The first impurity region, i.e., the semiconductor pattern 134b may have a second impurity concentration higher than the first impurity concentration. The first impurity region may be doped with impurities of a p-type. A depth of the recess 105 may be controlled to adjust a depth of the first impurity region from the substrate 100.

A pillar structure may be formed on the semiconductor pattern 134b. The pillar structure may be substantially the same as that of the pillar structure of FIG. 1.

In example embodiments, a plurality of pillar structures may be formed both in the second and third directions. A plurality of gate structures 176 each of which may extend in the second direction and surround sidewalls of the pillar structures may be formed in the first direction. Insulating interlayers 110 may be interposed between the gate structures 176 arranged at different levels in the first direction. That is, the gate structures 176 spaced apart from each other in the first direction may be electrically insulated from each other by the insulating interlayers 110. Each of the gate structures 176 at each level may surround sidewalls of the pillar structures included in the plurality of pillar structure columns.

At least one gate structure 176, e.g., a lowermost one of the gate structures 176 may be referred to as a first gate structure 176a, and the gate electrode of the first gate structure 176a may serve as a ground selection line of the GST. The other gate structures 176 may be referred to as second gate structures 176.

The first gate structures 176a may extend in the second direction and surround sidewalls of the semiconductor patterns 134b. The second gate structures 176 may extend in the second direction and surround sidewalls of the pillar structures. A top surface of the semiconductor pattern 134b may be higher than or substantially coplanar with a top surface of the first gate structure 176a.

A third impurity region 162 serving as a common source line (CSL) may be formed at an upper portion of the substrate 100 adjacent to end portions of the gate structures 176. The third impurity region 162 may be doped with impurities of a second conductive type at a high concentration, and may have a second depth from the top surface of the substrate 100.

A fourth impurity region 102a may be formed at upper portions of the substrate between the first and third impurity regions 134b and 162, and also between the first impurity regions 134b. The fourth impurity region 102a may have a fourth impurity concentration lower than the second and third impurity concentration. The fourth impurity region 102a may have a third depth from the top surface of the substrate 100. The third depth may be smaller than the first and second depth.

The fourth impurity region 102a may have impurities of the first conductive type or the second conductive type.

The semiconductor pattern 134b of this vertical memory device may extend at a recessed portion of the substrate. The fourth impurity region 102a serving as a horizontal channel region of the GST may contact the sidewalls of the semiconductor pattern 134b.

In this vertical memory device, the fourth impurity region 102a serving the horizontal channel region H may be electrically connected to the CSL or a horizontal transistor including the horizontal channel region H may have a turn-on status. Thus, the characteristic distribution of the memory cell due to the channel length difference in the GST may be reduced.

The semiconductor pattern 134b of this vertical memory device may extend at a recessed portion of the substrate. The first impurity region may be formed at the semiconductor pattern 134b. On-currents of the GST may be increased.

Figure 15:
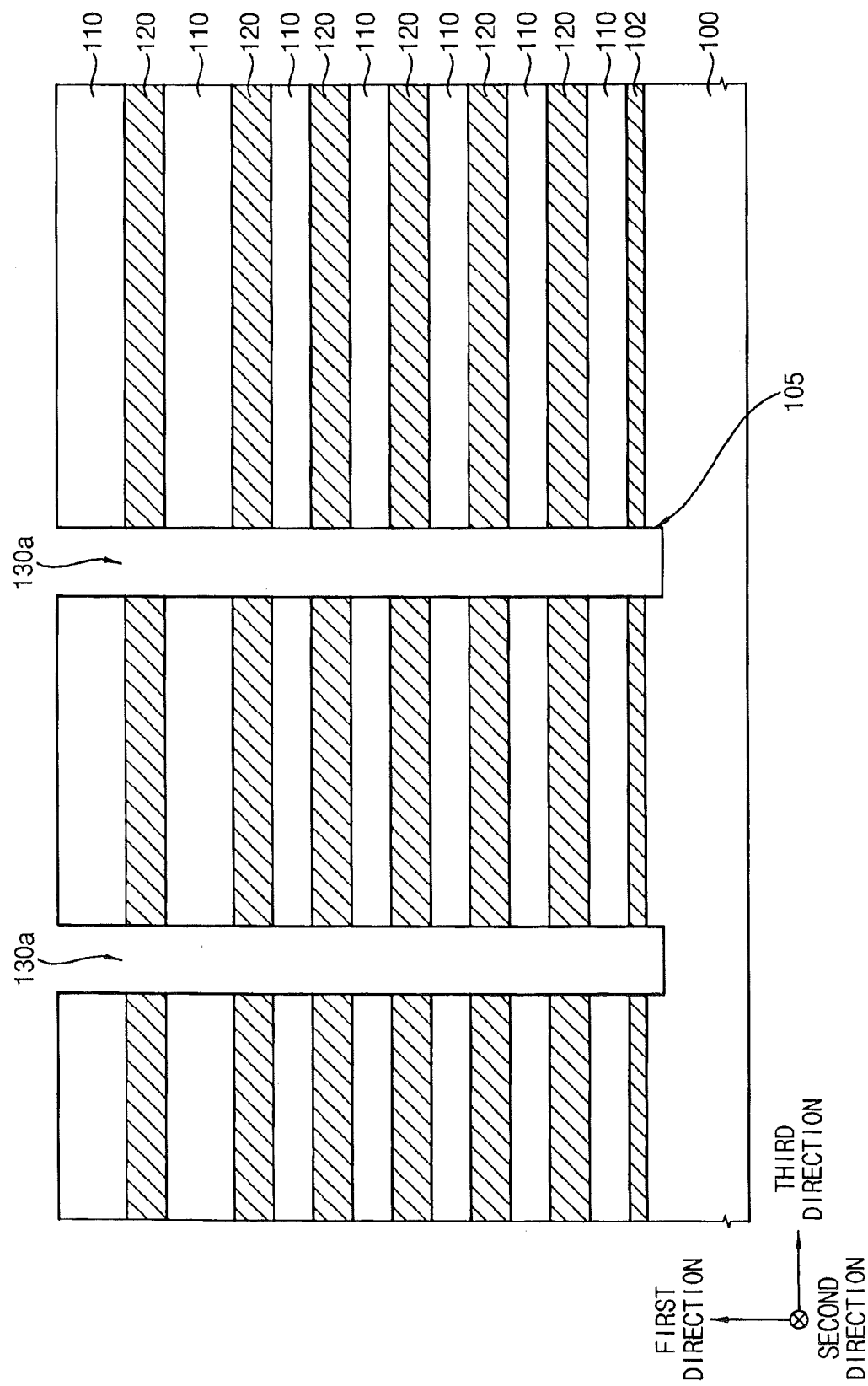
FIGS. 15 to 17 are cross-sectional views illustrating stages of a method of manufacturing the vertical memory device of FIG. 14.
Figure 16:
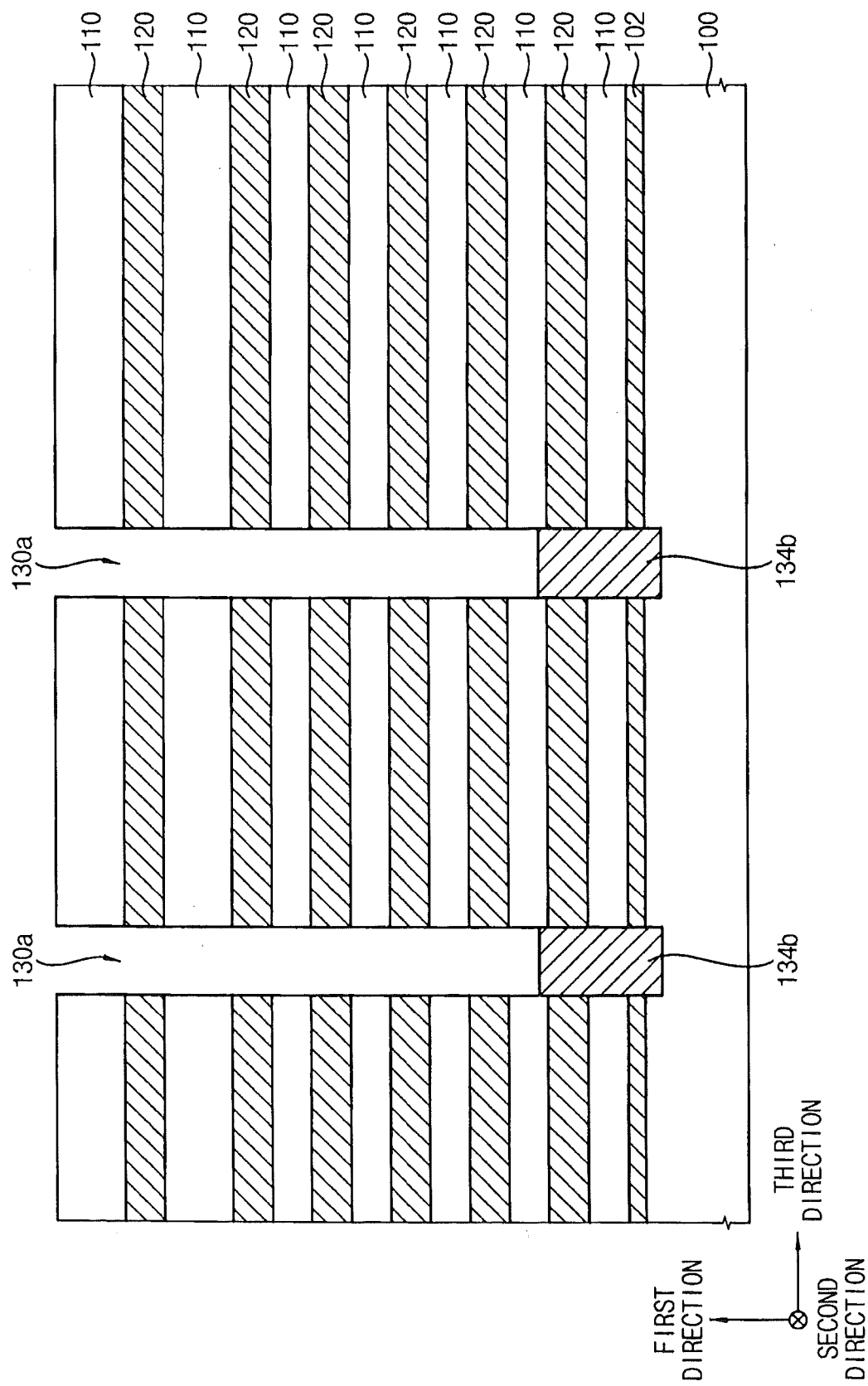
Figure 17:
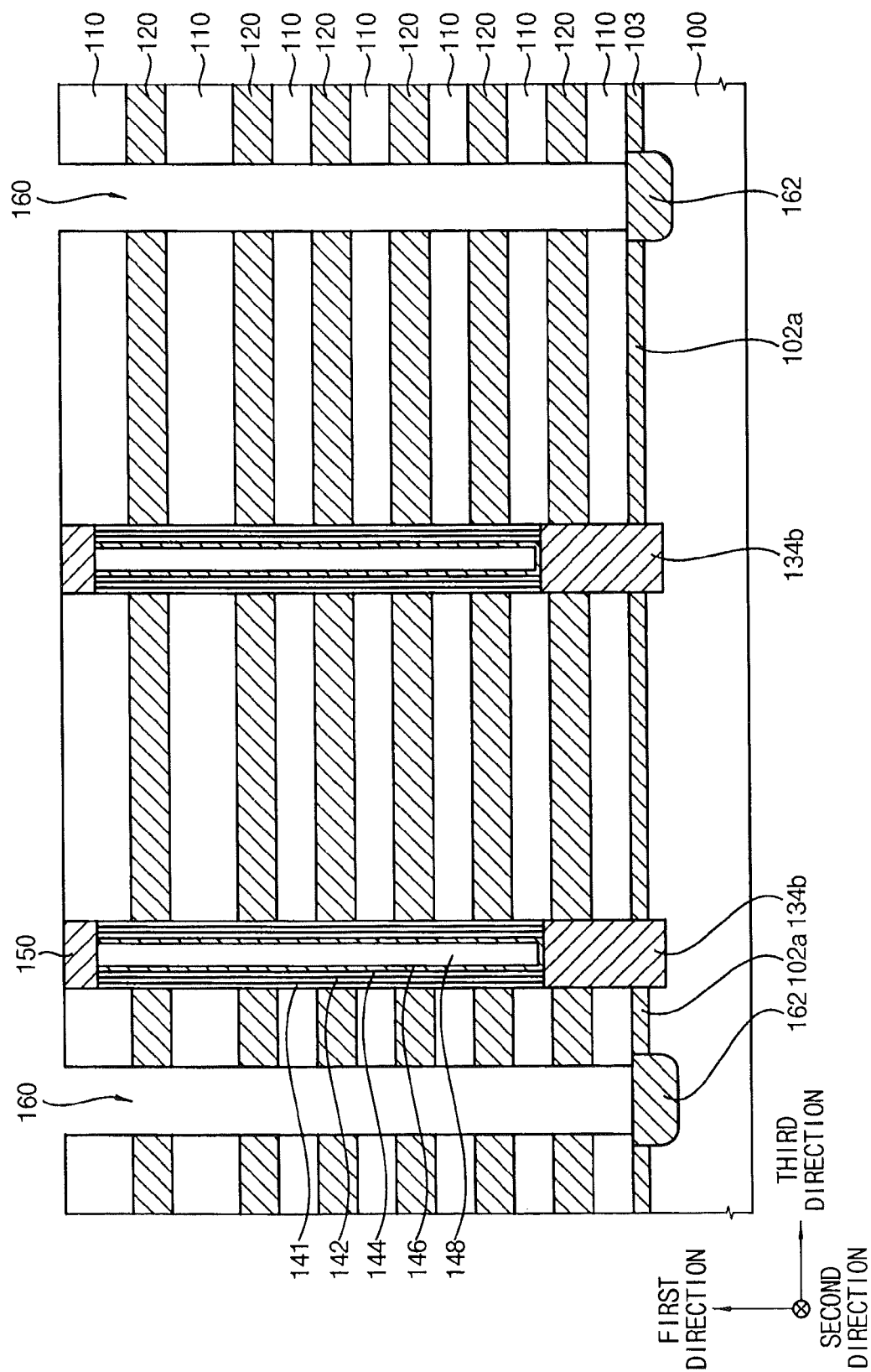

FIGS. 15 to 17 are cross-sectional views illustrating stages of a method of manufacturing the vertical memory device of FIG. 14.

Processes substantially the same as or similar to those illustrated with reference to FIGS. 4 and 5 may be performed to form sacrificial layers and insulating interlayers.

Referring to FIG. 15, a plurality of channel holes 130a may be formed through the sacrificial layers 120 and the insulating interlayers 110 to define a channel hole array, and also may remove a upper portion of the substrate 100 to form a recess 105 with a first depth from a top surface of the substrate 100. The first depth is greater than a third depth of a preliminary impurity region 102. The preliminary impurity region 102 may be divided by the recess 105.

Referring to FIG. 16, a semiconductor pattern 134b may be formed to fill a lower portion of each channel hole 130. In example embodiments, a top surface of the semiconductor pattern 134b may be higher than or substantially coplanar with a top surface of a lowermost sacrificial layer 120. The first impurity region may have a second impurity concentration higher than the first impurity concentration.

Processes for forming the semiconductor pattern 134b and the first impurity region may be substantially the same as those illustrated with reference to FIG. 7. In example embodiments, in the SEG process for forming the semiconductor patterns 134b, impurities of the first conductive type may be doped, so that first impurity regions doped with the first conductive type impurities may be formed in the semiconductor patterns 134b, respectively. That is, an additional ion implantation process for forming the first impurity regions may not be needed. The first impurity regions may have a second impurity concentration higher than the first impurity concentration.

Alternatively, after the SEG process for forming the semiconductor patterns 134b, the semiconductor patterns 134b may be doped with impurities of the first conductive type to form the first impurity regions. That is, an additional ion implantation process for forming the first impurity regions may be performed. In an example embodiment, the SEG process and the ion implantation process may be performed in-situ. The first impurity regions may have the second impurity concentration higher than the first impurity concentration. When the first conductive type is a p-type, the doped impurities may include boron.

The semiconductor pattern 134b protruding from a top surface of the substrate 100 may fill the recess 105 of the substrate 100. A bottom surface of the semiconductor pattern 134b may be lower than the top surface of the substrate 100. A bottom surface of the first impurity region may be lower than a bottom surface of the preliminary impurity region 102.

Referring to FIG. 17, a pillar structure may be formed in each channel hole 130a. Processes for formation of the pillar structure may be substantially the same as those illustrated with reference to FIG. 8.

An opening 160 may be formed through the insulating interlayers 110 and the sacrificial layers 120 to expose a top surface of the substrate 100. In example embodiment, a plurality of openings 160 each of which may extend in the second direction may be formed in the third direction.

A third impurity region 162 may be formed by implanting impurities of the second conductive type into the substrate 100 exposed by each opening 160. The third impurity region 162 may be formed to serve as the CSL. The preliminary fourth impurity region 102 may be transformed into a fourth impurity region 102a. The fourth impurity region 102a may contact end portions of the first and the third impurity regions 134b and 162, and may be arranged between the first and third impurity regions 134b and 162 or between the first impurity regions 134b.

By performing subsequent processes illustrated with reference to FIG. 2, the vertical memory device in FIG. 14 may be manufactured.

Figure 18:
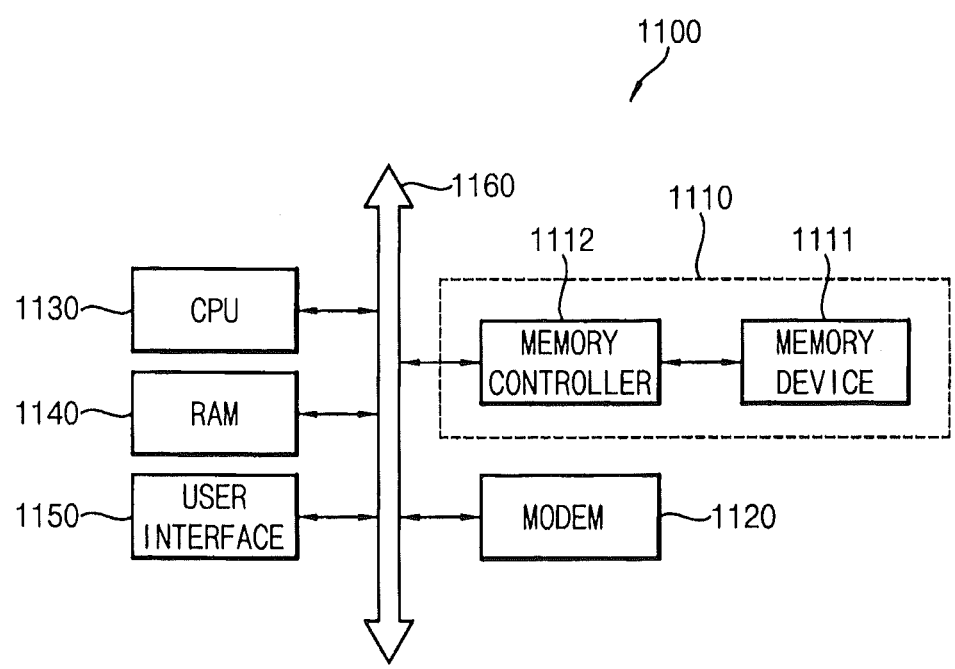
FIG. 18 is a block diagram illustrating a data processing system in accordance with example embodiments.

FIG. 18 is a block diagram illustrating a data processing system in accordance with example embodiments.

Referring to FIG. 18, a data processing system 1100 may include a vertical memory device 1111 in accordance with example embodiments.

The data processing system 1100 may include a memory system 1110, a modem 1120, a CPU 1130, a RAM 1140 and a user interface 1150, all of which may be electrically connected to a system bus 1160. Data is inputted/outputted to/from the memory device 1111 via the memory controller 1112 to be processed at the CPU 1130. The memory system may include the memory device 1111 and the memory controller 1112 such that the data processing system 1100 may store large amounts of data, reliably.

Although it is not illustrated, a data processing system in accordance with example embodiments may further include an application chipset, a camera image processor (CIS), mobile DRAM or input/output device.

While example embodiments have been particularly shown and described, it will be understood by one of ordinary skill in the art that variations in form and detail may be made therein without departing from the principles and spirit of the general inventive concepts, the scope of which is defined in the appended claims and their equivalents.

What is claimed is:

1. A memory device, comprising:
 a plurality of semiconductor patterns on a substrate, each of the plurality of semiconductor patterns comprising a first region doped with impurities at a first concentration;
 a plurality of second regions at a plurality of first upper portions of the substrate, wherein each of the plurality of second regions contacts one of the plurality of semiconductor patterns and is doped with impurities at a second concentration;
 a plurality of channel patterns on the plurality of semiconductor patterns, wherein each of the plurality of channel patterns corresponds to a respective one of the plurality of semiconductor patterns and extends in a first direction substantially perpendicular to a top surface of the substrate;

a plurality of gate structures, wherein each of the plurality of gate structures extends in a second direction substantially parallel to the top surface of the substrate and is adjacent to a sidewall of each of one or more of the plurality of channel patterns, and wherein the plurality of gate structures are spaced apart from each other in the first direction;

a plurality of third regions at a plurality of second upper portions of the substrate adjacent to end portions of the plurality of gate structures, wherein each of the plurality of third regions is doped with impurities and is configured to provide a common source line; and a plurality of fourth regions at a plurality of third upper portions of the substrate between the second and third regions and between adjacent second regions, wherein each of the plurality of fourth regions is doped with impurities at a third concentration, and wherein the third concentration is lower than the first and second concentrations, wherein the plurality of first and second regions are configured to provide a plurality of vertical channel regions of a plurality of ground selection transistors and the plurality of fourth regions are configured to provide a plurality of horizontal channel regions thereof.

2. The memory device of claim 1, wherein the impurities of the plurality of fourth regions comprise a first conductive type or a second conductive type.

3. The memory device of claim 1, wherein a top surface of each of the plurality of semiconductor patterns is coplanar with or lower than a top surface of a lowermost one of the plurality of gate structures in the first direction relative to the top surface of the substrate.

4. The memory device of claim 1, wherein a top surface of each of the plurality of semiconductor patterns is higher than a top surface of a lowermost one of the plurality of gate structures in the first direction relative to the top surface of the substrate.

5. The memory device of claim 1, wherein each of the plurality of second regions comprises a first depth from the top surface of the substrate, and each of the plurality of fourth regions comprises a second depth from the top surface of the substrate, wherein the second depth is less deep than the first depth.

6. The memory device of claim 1, wherein the substrate is doped at a fourth concentration with impurities, wherein the fourth concentration is lower than the first and second concentrations.

7. The memory device of claim 1, further comprising a plurality of recessed portions of the substrate, wherein each of the plurality of semiconductor patterns extends from a respective one of the plurality of recessed portions.

8. The memory device of claim 1, wherein the plurality of channel patterns are arranged in a plurality of channel pattern columns which extend in the second direction, and wherein the plurality of channel pattern columns are arranged in a channel pattern array which extends in a third direction which is substantially parallel to the top surface of the substrate and substantially perpendicular to the second direction.

9. The memory device of claim 8, wherein each of the plurality of gate structures is adjacent to a sidewall of each of the plurality of channel patterns included in at least two of the plurality of channel pattern columns.

10. The memory device of claim 1,
wherein a top surface of each of the plurality of semiconductor patterns contacts one of the plurality of channel patterns at a height in the first direction that is remote from the top surface of the substrate, and
wherein a bottom surface of each of the plurality of semiconductor patterns contacts one of the plurality of second regions at the top surface of the substrate.

11. The memory device of claim 1, wherein a portion of each of the channel patterns overlies a portion of one of the first regions and a portion of one of the second regions in the first direction.

12. A memory device, comprising:
a semiconductor substrate comprising a first concentration of a first conductivity type of impurity;
a plurality of semiconductor patterns on the substrate, each of the plurality of semiconductor patterns comprising a second concentration of the first conductivity type of impurity, wherein the second concentration is greater than the first concentration;
a plurality of channel patterns on the plurality of semiconductor patterns, wherein each of the plurality of channel patterns corresponds to a respective one of the plurality of semiconductor patterns and extends substantially perpendicular to a top surface of the substrate;
a plurality of gate structures, wherein each of the plurality of gate structures extends substantially parallel to the top surface of the substrate;
a plurality of common source lines at the top surface of the substrate, wherein each of the plurality of common source lines is adjacent to end portions of the plurality of gate structures and comprises a second conductivity type of impurity, wherein the second conductivity type of impurity is different from the first conductivity type of impurity; and
a plurality of channel regions at the top surface of the substrate extending between the plurality of semiconductor patterns and the plurality of common source lines and between adjacent semiconductor patterns and comprising a third concentration of impurity, wherein the third concentration is less than the second concentration,
wherein a top surface of each of the plurality of semiconductor patterns contacts one of the plurality of channel patterns at a height that is remote from the top surface of the substrate in a first direction that is perpendicular to the top surface of the substrate.

13. The memory device of claim 12, wherein the channel regions are first channel regions and the memory device further comprises a plurality of second channel regions at the top surface of the substrate, each of the plurality of second channel regions comprising a fourth concentration of the first conductivity type of impurity and contacting a respective one of the plurality of semiconductor patterns, wherein the fourth concentration is greater than the first concentration and greater than the third concentration.

14. The memory device of claim 12, wherein each of the plurality of semiconductor patterns extends from a recessed portion of the substrate.

15. The memory device of claim 12, wherein the top surface of each of the plurality of semiconductor patterns is coplanar with or higher than a top surface of a lowermost one of the plurality of gate structures relative to the top surface of the substrate.

16. The memory device of claim 12, wherein the top surface of each of the plurality of semiconductor patterns is coplanar with or lower than a bottom surface of a lowermost one of the plurality of gate structures relative to the top surface of the substrate.

17. The memory device of claim 12, wherein each of the plurality of channel regions comprises the first conductivity type of impurity.

18. A memory device, comprising:
- a semiconductor substrate comprising a first concentration of a first conductivity type of impurity;
- a plurality of semiconductor patterns on the substrate, each of the plurality of semiconductor patterns comprising a second concentration of the first conductivity type of impurity, wherein the second concentration is greater than the first concentration;
- a plurality of channel patterns on the plurality of semiconductor patterns, wherein each of the plurality of channel patterns corresponds to a respective one of the plurality of semiconductor patterns and extends substantially perpendicular to a top surface of the substrate;
- a plurality of gate structures, wherein each of the plurality of gate structures extends substantially parallel to the top surface of the substrate;
- a plurality of common source lines at the top surface of the substrate, wherein each of the plurality of common source lines is adjacent to end portions of the plurality of gate structures and comprises a second conductivity type of impurity, wherein the second conductivity type of impurity is different from the first conductivity type of impurity; and
- a plurality of channel regions at the top surface of the substrate extending between the plurality semiconductor patterns and the plurality of common source lines and between adjacent semiconductor patterns and comprising a third concentration of impurity, wherein the third concentration is less than the second concentration,
- wherein a portion of each of the channel patterns overlies a portion of one of the semiconductor patterns in a first direction that is perpendicular to the top surface of the substrate.

19. The memory device of claim 18, wherein the channel regions are first channel regions and the memory device further comprises a plurality of second channel regions at the top surface of the substrate, each of the plurality of second channel regions comprising a fourth concentration of the first conductivity type of impurity and contacting a respective one of the plurality of semiconductor patterns, wherein the fourth concentration is greater than the first concentration and greater than the third concentration.

20. The memory device of claim 18, wherein each of the plurality of semiconductor patterns extends from a recessed portion of the substrate.

21. The memory device of claim 18, wherein a top surface of each of the plurality of semiconductor patterns is coplanar with or higher than a top surface of a lowermost one of the plurality of gate structures relative to the top surface of the substrate.

22. The memory device of claim 18, wherein a top surface of each of the plurality of semiconductor patterns is coplanar with or lower than a bottom surface of a lowermost one of the plurality of gate structures relative to the top surface of the substrate.

23. The memory device of claim 18, wherein each of the plurality of channel regions comprises the first conductivity type of impurity.

24. The memory device of claim 18, wherein each of the plurality of channel regions comprises the second conductivity type of impurity.

* * * * *